US 12,169,423 B2

(12) United States Patent
An et al.

(10) Patent No.: US 12,169,423 B2
(45) Date of Patent: Dec. 17, 2024

(54) FLEXIBLE DISPLAY MODULE INCLUDING SHIELDING STRUCTURE AND WATERPROOF STRUCTURE AND ELECTRONIC DEVICE INCLUDING THE SAME

(71) Applicant: SAMSUNG ELECTRONICS CO., LTD., Suwon-si (KR)

(72) Inventors: Jungchul An, Suwon-si (KR); Hyunho Shin, Suwon-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 224 days.

(21) Appl. No.: 17/892,543

(22) Filed: Aug. 22, 2022

(65) Prior Publication Data

US 2023/0047246 A1 Feb. 16, 2023

Related U.S. Application Data

(63) Continuation of application No. PCT/KR2022/011236, filed on Jul. 29, 2022.

(30) Foreign Application Priority Data

Aug. 10, 2021 (KR) .................. 10-2021-0105275

(51) Int. Cl.
*G06F 1/16* (2006.01)
*G01R 33/07* (2006.01)

(52) U.S. Cl.
CPC ......... *G06F 1/1656* (2013.01); *G01R 33/072* (2013.01); *G06F 1/1643* (2013.01); *G06F 1/1652* (2013.01); *G06F 2200/1637* (2013.01)

(58) Field of Classification Search
CPC .... G06F 1/1656; G06F 1/1643; G06F 1/1652; G06F 3/041; G06F 1/1616; G06F 1/1647;
(Continued)

(56) References Cited

U.S. PATENT DOCUMENTS 9,798,359 B2 * 10/2017 Seo .................. G06F 1/1652
9,930,799 B2 3/2018 Moon et al.
(Continued)

FOREIGN PATENT DOCUMENTS

KR 10-2020-0057236 5/2020
KR 10-2020-0090476 7/2020
(Continued)

OTHER PUBLICATIONS

Search Report and Written Opinion dated Nov. 9, 2022 issued in International Patent Application No. PCT/KR2022/011236.
(Continued)

*Primary Examiner* — Anthony M Haughton
*Assistant Examiner* — Theron S Milliser
(74) *Attorney, Agent, or Firm* — Nixon & Vanderhye, P.C.

(57) ABSTRACT

An electronic device according to various embodiment disclosed in the disclosure may include a digitizer panel, a first shielding member which includes a first first shielding member and a second first shielding member disposed on the digitizer panel, the first shielding member being disposed on the rear surface of the digitizer panel, a reinforced plate disposed on the rear surface of the first shielding member, a second shielding member at least a part of which is disposed on the rear surface of the first shielding member, and a waterproof structure, at least a part of which is disposed on the rear surface of the reinforced plate, comprising a waterproof material including a first waterproof member, and a second waterproof member.

20 Claims, 11 Drawing Sheets

(58) Field of Classification Search
CPC ... G06F 1/1681; G06F 3/0412; G01R 33/072; G01R 33/0047; G01R 33/0076; G01R 33/038; H04M 1/02; H04M 1/0216; H04M 1/0269; H05K 5/06; H05K 9/00; H05K 5/061; H05K 9/0075

See application file for complete search history.

(56) References Cited

U.S. PATENT DOCUMENTS

| | | | | |
|---|---|---|---|---|
| 10,120,415 | B2* | 11/2018 | Seo | G06F 1/1681 |
| 10,423,196 | B2* | 9/2019 | Seo | G06F 1/1652 |
| 10,459,490 | B2* | 10/2019 | Lin | G06F 1/1679 |
| 10,539,981 | B2* | 1/2020 | Lin | H04M 1/0216 |
| 10,901,464 | B2* | 1/2021 | Seo | G06F 1/1652 |
| 11,086,159 | B2* | 8/2021 | Kim | H10K 59/00 |
| 11,191,195 | B2* | 11/2021 | Baek | H01F 27/366 |
| 11,243,564 | B2* | 2/2022 | Kim | G06F 1/1656 |
| 11,275,404 | B2* | 3/2022 | Bae | G06F 3/046 |
| 11,300,996 | B2* | 4/2022 | Kim | G06F 1/1637 |
| 11,425,831 | B2* | 8/2022 | Kim | H05K 5/0017 |
| 11,528,349 | B2* | 12/2022 | Kim | H04M 1/0216 |
| 11,567,540 | B2* | 1/2023 | Seo | G06F 1/1681 |
| 11,592,865 | B2* | 2/2023 | Moon | G06F 1/1641 |
| 11,836,003 | B2* | 12/2023 | Bae | G06F 3/04186 |
| 11,886,238 | B2* | 1/2024 | Shin | G06F 1/1616 |
| 11,930,127 | B2* | 3/2024 | Kim | H05K 3/361 |
| 12,007,814 | B2* | 6/2024 | Kim | G06F 1/1681 |
| 2015/0241925 | A1* | 8/2015 | Seo | G06F 1/1652 361/679.27 |
| 2017/0364123 | A1* | 12/2017 | Seo | G06F 1/1652 |
| 2018/0364761 | A1* | 12/2018 | Lin | G06F 1/1652 |
| 2019/0025887 | A1* | 1/2019 | Seo | G06F 1/1652 |
| 2019/0086966 | A1* | 3/2019 | Lin | G06F 1/1616 |
| 2019/0163003 | A1* | 5/2019 | Kim | G06F 1/1626 |
| 2019/0369671 | A1* | 12/2019 | Seo | G06F 1/1652 |
| 2020/0162596 | A1* | 5/2020 | Kim | G06F 1/1616 |
| 2020/0236826 | A1* | 7/2020 | Baek | H01F 27/366 |
| 2020/0267861 | A1 | 8/2020 | Kim | |
| 2020/0319672 | A1* | 10/2020 | Kim | G06F 1/1656 |
| 2020/0352046 | A1* | 11/2020 | Kim | H04M 1/0268 |
| 2021/0116964 | A1* | 4/2021 | Moon | G06F 1/1637 |
| 2021/0141422 | A1* | 5/2021 | Seo | G06F 1/1681 |
| 2021/0173437 | A1* | 6/2021 | Bae | H10K 59/40 |
| 2021/0255666 | A1* | 8/2021 | Kim | H04M 1/0268 |
| 2021/0286407 | A1* | 9/2021 | Kim | H04M 1/0216 |
| 2022/0043481 | A1* | 2/2022 | Shin | G06F 1/1616 |
| 2022/0197442 | A1* | 6/2022 | Bae | G06F 3/046 |
| 2023/0071540 | A1* | 3/2023 | Kim | H05K 1/148 |
| 2023/0095925 | A1* | 3/2023 | Kim | G06F 1/1681 361/679.01 |
| 2023/0221761 | A1* | 7/2023 | Moon | G06F 1/1641 361/679.02 |
| 2024/0195895 | A1* | 6/2024 | Kim | H04M 1/18 |

FOREIGN PATENT DOCUMENTS

| | | |
|---|---|---|
| KR | 10-2165647 | 10/2020 |
| KR | 10-2020-0124099 | 11/2020 |
| KR | 10-2021-0016983 | 2/2021 |
| WO | 2020/098535 | 5/2020 |

OTHER PUBLICATIONS

Extended European Search Report dated Aug. 29, 2024 issued in European Patent Application No. 22856078.5.

* cited by examiner

FLEXIBLE DISPLAY MODULE INCLUDING SHIELDING STRUCTURE AND WATERPROOF STRUCTURE AND ELECTRONIC DEVICE INCLUDING THE SAME

CROSS-REFERENCE TO RELATED APPLICATIONS

This application is a continuation of International Application No. PCT/KR2022/011236 designating the United States, filed on Jul. 29, 2022, in the Korean Intellectual Property Receiving Office and claiming priority to Korean Patent Application No. 10-2021-0105275, filed on Aug. 10, 2021, in the Korean Intellectual Property Office, the disclosures of which are incorporated by reference herein in their entireties.

BACKGROUND

Field

The disclosure relates to a flexible display module including a magnetic shielding structure and a waterproof structure, and an electronic device including the same.

Description of Related Art

An increasing number of users want displays having larger screens in line with the increasing amount of visually displayed information and more functions supported by electronic devices. There has been development of a new type of electronic devices for providing displays having larger screens while maintaining portable sizes.

Development of display technologies has made it possible to implement foldable displays. Area-variable electronic devices capable of displaying information through folding, using such displays, are commercially available.

Electronic devices may support various kinds of pen input devices. Some electronic devices may include a display module having a separate component (for example, digitizer) for recognizing inputs through a pen input device.

Meanwhile, an electronic device may require a sealed waterproof and/or dustproof structure for preventing electronic components disposed in the inner space from being damaged by moisture and/or foreign materials from the outside. In addition, a shielding structure may be required such that electronic components included in the electronic device can operate with designated quality.

In the case of a digitizer panel configured to recognize pen inputs using an electromagnetic resonance phenomenon, there may occur a problem of failure to normally recognize pen inputs due to external magnetic fields. It may be necessary to apply a shielding structure to magnetically shield the digitizer panel.

Moreover, the electronic device may include a waterproof structure and/or a dustproof structure capable of protecting electronic components from external moisture or foreign materials.

The shielding structure and the waterproof structure, if simultaneously applied, may have the same range that requires application and thus may interfere with each other.

SUMMARY

Embodiments of the disclosure may provide a display module including both a shielding structure for normal operations of a digitizer and a waterproof structure capable of protecting electronic components from external moisture or foreign materials, based on consideration of interference between the shielding structure and the waterproof structure, and an electronic device including the same.

An electronic device according to various example embodiments disclosed herein may include: a housing including a first housing and a second housing foldably connected with respect to the first housing, a magnet member including a first magnet disposed in the first housing and a second magnet disposed in the second housing to face the first magnet based on the housing being in a folded state, a hinge configured to foldably connect the first housing and the second housing, and a flexible display module configured such that at least a part thereof is folded by folding of the housing, wherein the flexible display module includes: a display panel formed configured to be deformed by folding of the housing, a digitizer panel including a first digitizer panel disposed in the first housing and including a first area adjacent to the hinge and a second area spaced apart from the hinge compared to the first area, and a second digitizer panel disposed in the second housing and including a third area adjacent to the hinge and a fourth area spaced apart from the hinge compared to the third area, the digitizer panel being disposed in a first direction with respect to the display panel, a first shielding member including a first first shielding member comprising a shield disposed on the first digitizer panel and a second first shielding member comprising a shield disposed on the second digitizer panel, the first shielding member being disposed on the rear surface of the digitizer panel, a reinforced plate including a first reinforced plate, at least a part of which is disposed in the first area of the first digitizer panel, and a second reinforced plate, at least a part of which is disposed in the third area of the second digitizer panel, the reinforced plate being disposed on the rear surface of the first shielding member, a second shielding member including a first second shielding member comprising a shield, at least a part of which is disposed on the rear surface of the first first shielding member in the second area of the first digitizer panel to be positioned between the first magnet and the first digitizer panel, a second second shielding member comprising a shield disposed on the rear surface of the first reinforced plate, and a third second shielding member, at least a part of which is disposed on the rear surface of the second first shielding member in the fourth area of the second digitizer panel to be positioned between the second magnet and the second digitizer panel, and a waterproof structure including a first waterproof member comprising a waterproof material, at least a part of which is disposed on the rear surface of the first reinforced plate disposed between the first second shielding member and the second second shielding member, and a second waterproof member comprising a waterproof material, at least a part of which is disposed in the first direction of the second reinforced plate.

A flexible display module supported by a first housing and a second housing foldably connected by a hinge and at least a part of which is configured to be folded according to various example embodiments disclosed herein may include: a display panel configured to be deformed by folding of the housing, a digitizer panel including a first digitizer panel disposed in the first housing and including a first area adjacent to the hinge device and a second area spaced apart from the hinge compared to the first area, and a second digitizer panel disposed in the second housing and including a third area adjacent to the hinge and a fourth area spaced apart from the hinge compared to the third area, the digitizer panel disposed in a first direction with respect to the display panel, a first shielding member including a first first shielding member comprising a shield disposed on the first digitizer panel and a second first shielding member comprising a shield disposed on the second digitizer panel, the first shielding member being disposed on the rear surface of the digitizer panel, a reinforced plate including a first reinforced plate, at least a part of which is disposed in the first area of the first digitizer panel, and a second reinforced plate, at least a part of which is disposed in the third area of the second digitizer panel, the reinforced plate being disposed on the rear surface of the first shielding member; a second shielding member including a first second shielding member comprising a shield, at least a part of which is disposed on the rear surface of the first first shielding member in the second area of the first digitizer panel disposed between a first magnet and the first digitizer panel, a second second shielding member comprising a shield disposed on the rear surface of the first reinforced plate, and a third second shielding member comprising a shield, at least a part of which is disposed on the rear surface of the second first shielding member in the fourth area of the second digitizer panel positioned between a second magnet and the second digitizer panel, and a waterproof structure including a first waterproof member comprising a waterproof material, at least a part of which is disposed on the rear surface of the first reinforced plate to be disposed between the first second shielding member and the second second shielding member, and a second waterproof member comprising a waterproof material, at least a part of which is disposed in the first direction of the second reinforced plate.

According to various example embodiments disclosed herein, a shielding structure may reduce the influence of a magnetic field generated by various components included in an electronic device on a digitizer panel. The digitizer panel may thus recognize a pen input device with designated quality.

In addition, a waterproof structure may prevent and/or reduce external moisture or foreign materials from penetrating into the electronic device, thereby accomplishing waterproof and dustproof functions of the electronic device.

BRIEF DESCRIPTION OF THE DRAWINGS

In connection with descriptions of the drawings, same or similar reference numerals will be used to refer to same or similar elements. Further, the above and other aspects, features and advantages of certain embodiments of the present disclosure will be more apparent from the following detailed description, taken in conjunction with the accompanying drawings, in which.

DETAILED DESCRIPTION

Figure 1A:
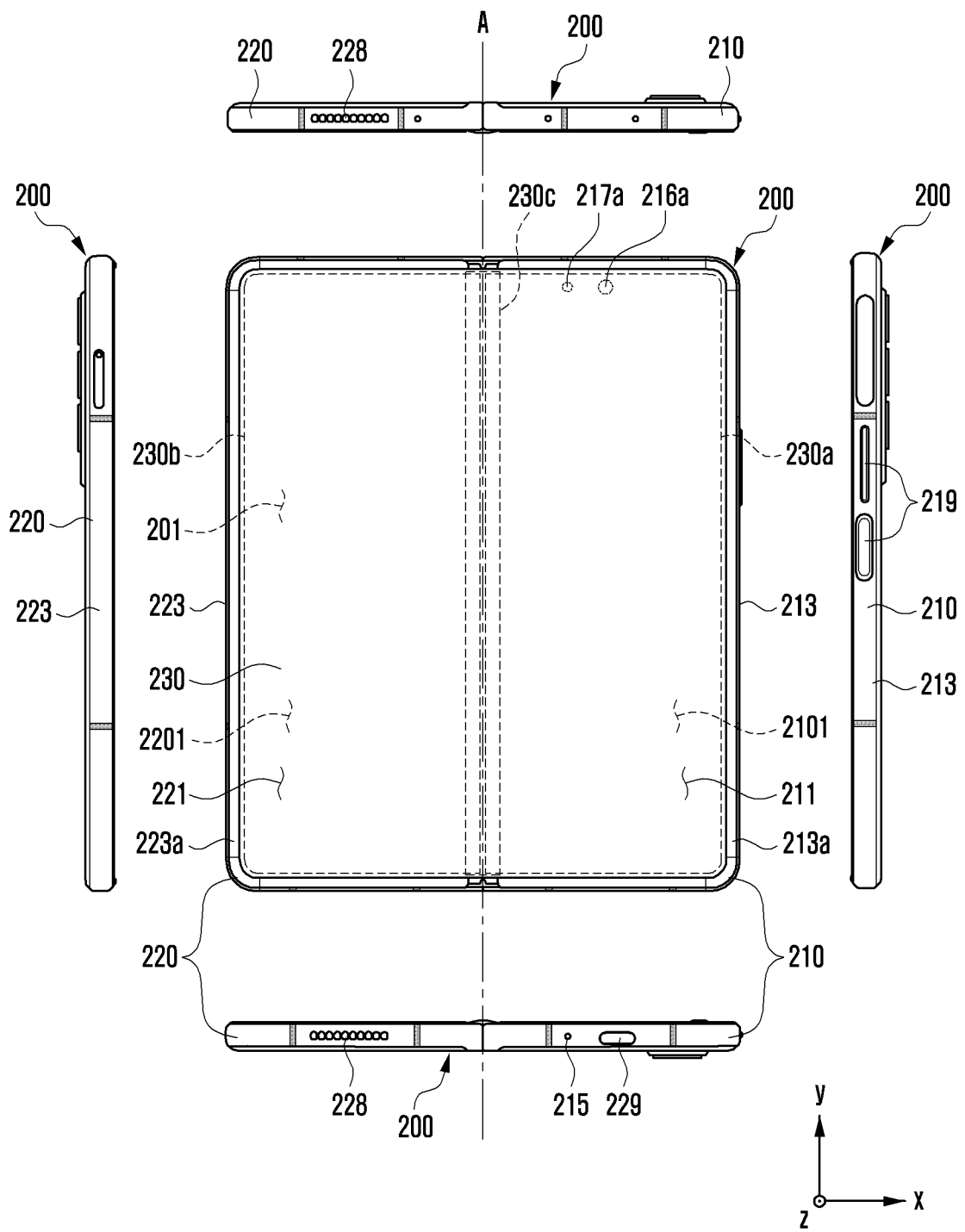
FIG. 1A and FIG. 1B are diagrams illustrating the front surface and the rear surface, respectively, of an electronic device in an unfolded state according to various embodiments.
Figure 1B:
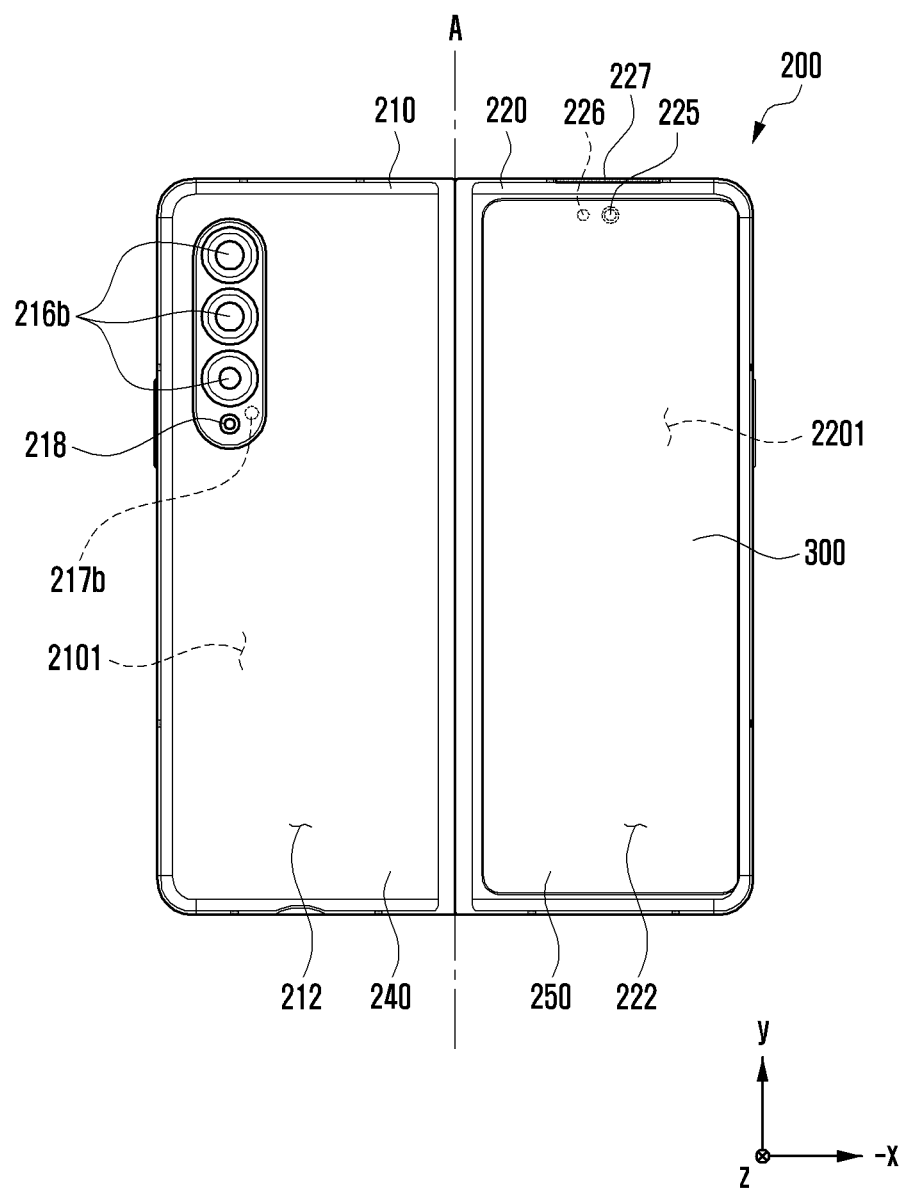
Figure 2A:
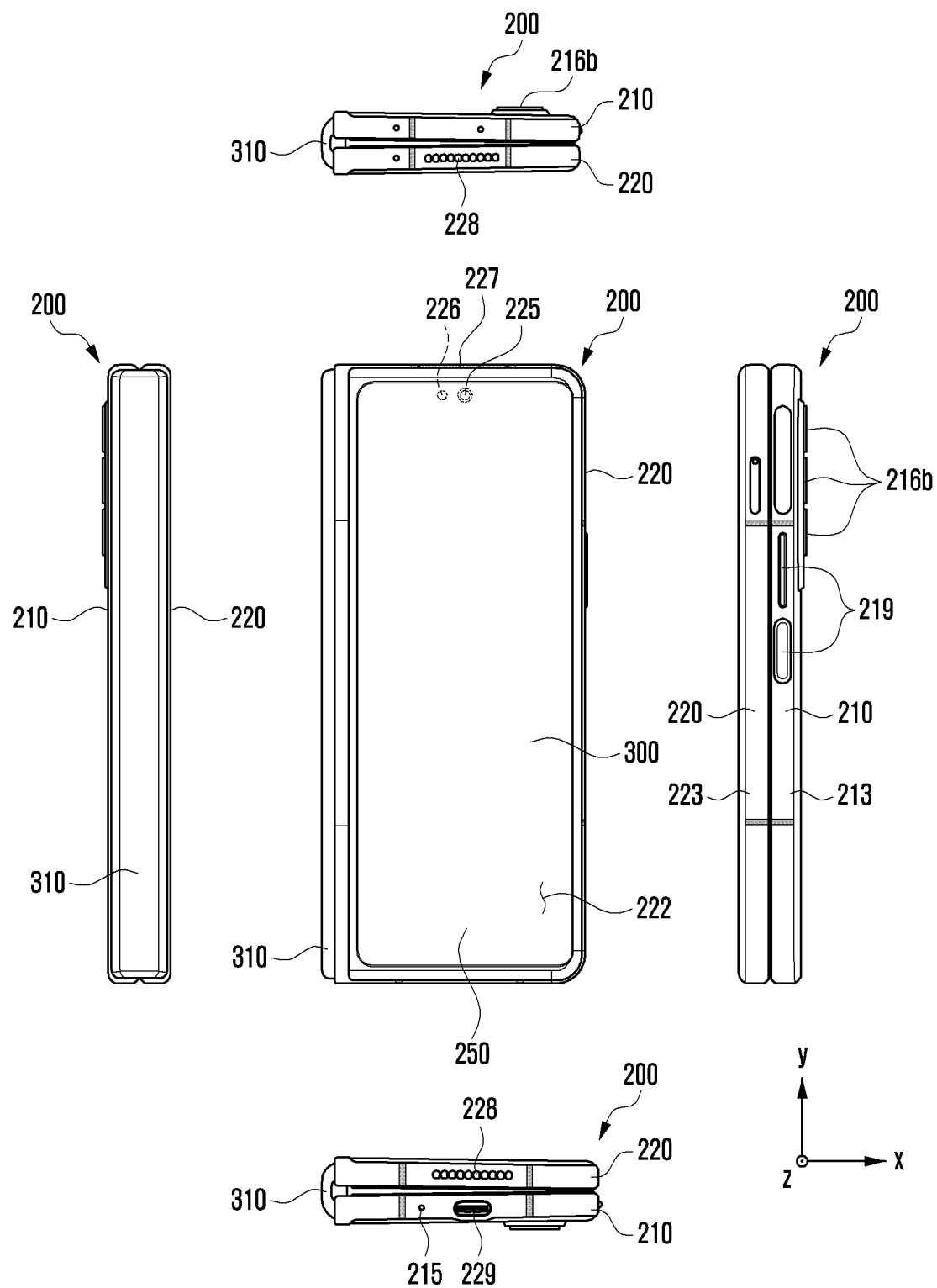
FIG. 2A and FIG. 2B are diagrams illustrating the front surface and the rear surface of an electronic device in a folded state according to various embodiments.
Figure 2B:
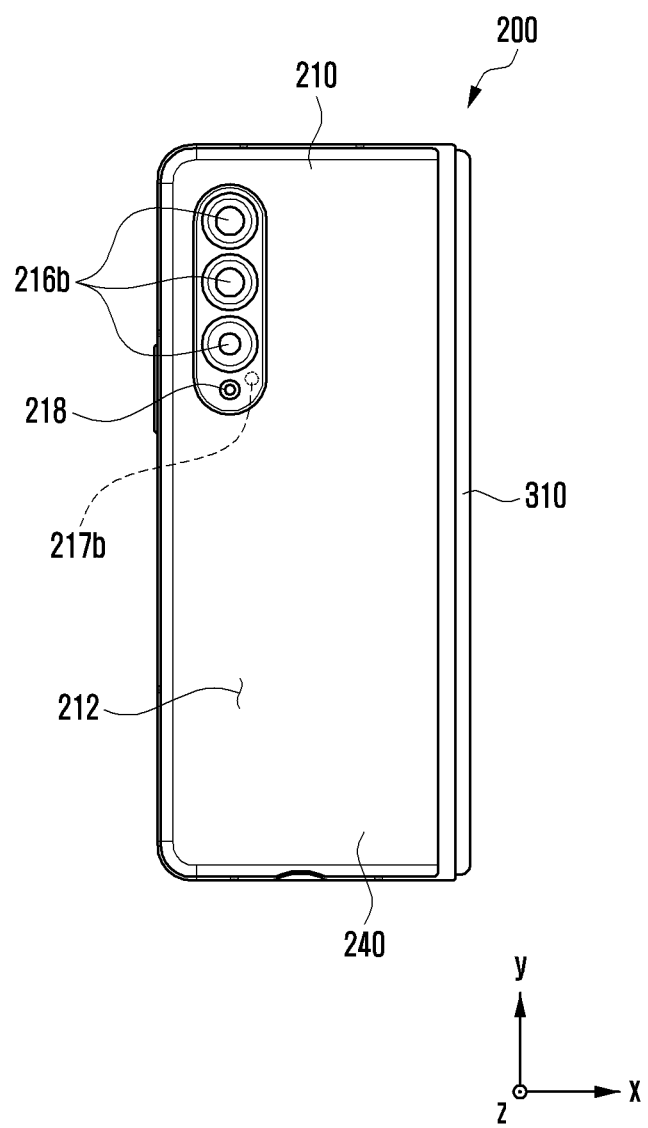

FIG. 1A and FIG. 1B are diagrams illustrating the front surface and the rear surface of an example foldable electronic device in an unfolded state according to various embodiments. FIG. 2A and FIG. 2B are diagrams illustrating the front surface and the rear surface of the foldable electronic device in a folded state according to various embodiments.

Referring to FIGS. 1A, 1B, 2A and 2B (which may be referred to as FIG. 1A to FIG. 2A), an electronic device 200 may include one pair of housings 210 and 220 (e.g., a foldable housing structure) which are rotatably coupled with reference to a folding axis A by a hinge device (e.g., the hinge device 320 of FIG. 3) (e.g., a hinge module) so as to be foldable with respect to each other, a first display 230 (e.g., a flexible display, a foldable display, or a main display) disposed through one pair of housings 210 and 220, and/or a second display 300 (e.g., a sub-display) disposed through a second housing 220. According to an embodiment, at least a part of the hinge device (e.g., the hinge device 320 of FIG. 3) may be disposed to be invisible from the outside through a first housing 210 and the second housing 220, and in an unfolded state, may be disposed to be invisible from the outside through a hinge housing 310 configured to cover a foldable part. According to an embodiment, the hinge device 320 may include a hinge module which includes multiple hinge cams coupled to a gear assembly including multiple gears and hinge shafts configured to rotate through the gear assembly and is configured to perform a cam interlocking operation, and hinge plates configured to connect the hinge module and the first housing 210 and the second housing 220. In the disclosure, a surface, on which the first display 230 is disposed, may be defined as the front surface of the electronic device 200, and a surface opposite to the front surface may be defined as the rear surface of the electronic device 200. In addition, a surface configured to surround a space between the front surface and the rear surface may be defined as a side surface of the electronic device 200.

Figure 3:
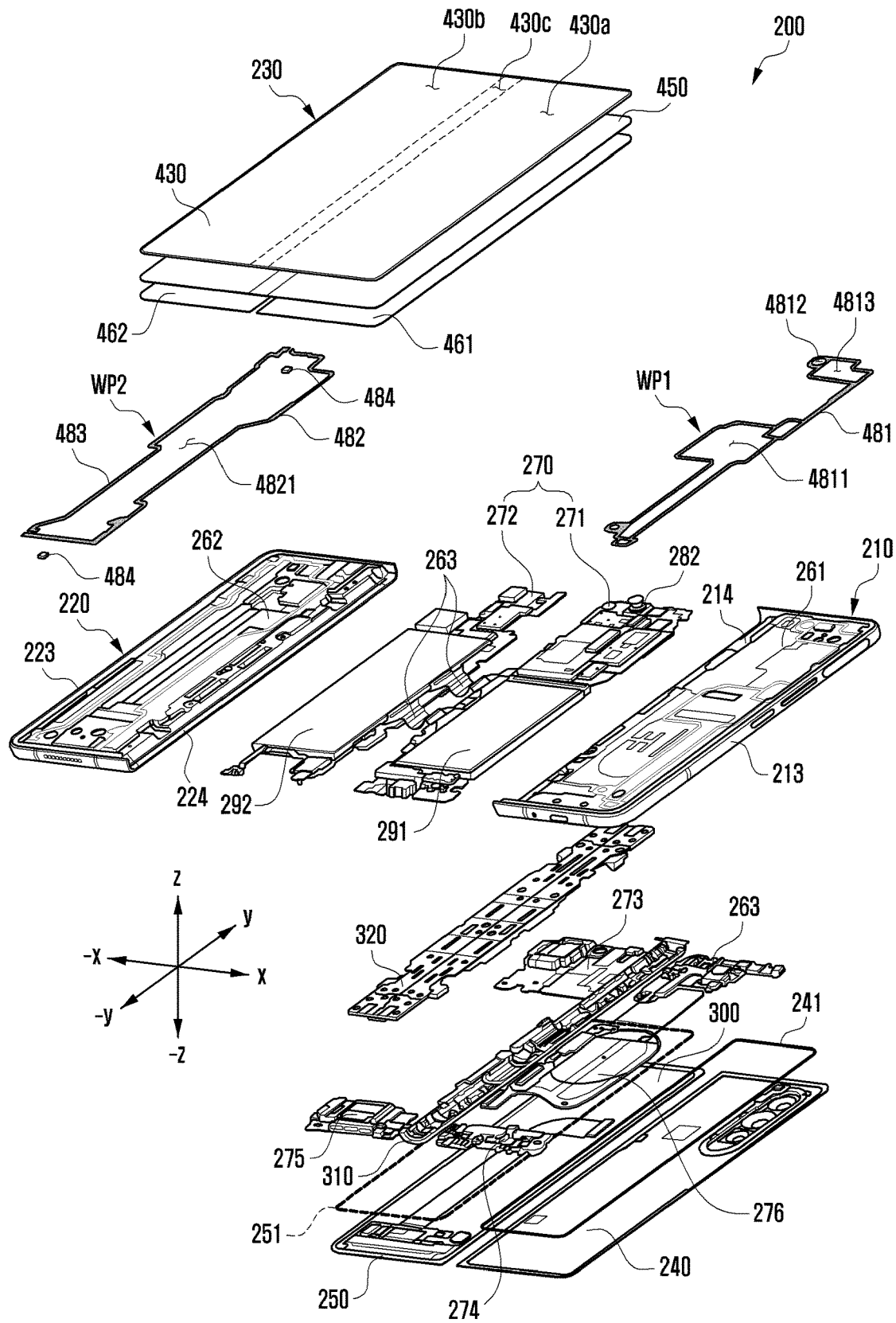
FIG. 3 is an exploded perspective view of an electronic device according to various embodiments.

According to various embodiments, the one pair of housings 210 and 220 may include the first housing 210 and the second housing 220 which are arranged to be foldable with respect to each other by the hinge device (e.g., the hinge device 320 of FIG. 3). According to various embodiments, the one pair of housings 210 and 220 may not be limited to the shape illustrated in FIG. 1A to FIG. 2B and couplings thereof, and be may implemented by combinations and/or couplings of other shapes or components. According to an embodiment, the first housing 210 and the second housing 220 may be arranged at both sides with reference to the folding axis A, and may have an overall symmetrical shape with respect to the folding axis A. According to various embodiments, the first housing 210 and the second housing 220 may be asymmetrically folded with reference to the folding axis A. According to an embodiment, the angle formed by the first housing 210 and the second housing 220 and the distance therebetween may be different according to whether the electronic device 200 is an unfolded state, a folded state, or an intermediate state.

According to various embodiments, when the electronic device 200 is in an unfolded state, the first housing 210 may be connected to the hinge device (e.g., the hinge device 320 of FIG. 3), and may include a first surface 211 disposed to face the front surface of the electronic device 200, a second surface 212 facing the opposite direction of the first surface 211, and/or a first side member 213 surrounding at least a part of a first space between the first surface 211 and the second surface 212. According to an embodiment, when the electronic device 200 is in an unfolded state, the second housing 220 may be connected to the hinge device (e.g., the hinge device 320 of FIG. 3), and may include a third surface 221 disposed to face the front surface of the electronic device 200, a fourth surface 222 facing the opposite direction of the third surface 221, and/or a second side member 223 surrounding at least a part of a second space between the third surface 221 and the fourth surface 222. According to an embodiment, the first surface 211 may face substantially the same direction as the third surface 221 in an unfolded state, and may at least partially face the third surface 221 in a folded state. According to an embodiment, the electronic device 200 may include a recess 201 formed to accommodate the first display 230 through the structural coupling between the first housing 210 and the second housing 220. According to an embodiment, the recess 201 may have substantially the same size as that of the first display 230. According to an embodiment, when the first display 230 is seen from above, the first housing 210 may include a first protective frame 213a (e.g., a first decorative member), which is coupled to the first side member 213 and disposed to overlap and cover the rim of the first display 230 so that the rim of the first display 230 is not seen from the outside. According to an embodiment, the first protective frame 213a may be integrally formed with the first side member 213. According to an embodiment, when the first display 230 is seen from above, the second housing 220 may include a second protective frame 223a (e.g., a second decorative member), which is coupled to the second side member 223 and disposed to overlap and cover the rim of the first display 230 so that the rim of the first display 230 is not seen from the outside. According to an embodiment, the second protective frame 223a may be integrally formed with the first side member 223. In various embodiments, the first protective frame 213a and the second protective frame 223a may be omitted.

According to various embodiments, the hinge housing 310 (e.g., a hinge cover) may be disposed between the first housing 210 and the second housing 220, and may be disposed to cover a part (e.g., at least one hinge module) of the hinge device (e.g., the hinge device 320 of FIG. 3) disposed in the hinge housing 310. According to an embodiment, according to an unfolded state, a folded state, or an intermediate state of the electronic device 200, the hinge housing 310 may be covered by a part of the first housing 210 and the second housing 220, or may be exposed to the outside. For example, when the electronic device 200 is in an unfolded state, at least a part of the hinge housing 310 may be covered by the first housing 210 and the second housing 220 so as not to be substantially exposed thereto. According to an embodiment, when the electronic device 200 is in a folded state, at least a part of the hinge housing 310 may be exposed to the outside between the first housing 210 and the second housing 220. According to an embodiment, when the first housing 210 and the second housing 220 are in an intermediate state in which the first housing and the second housing are folded with a certain angle, the hinge housing 310 may be at least partially exposed outside the electronic device 200 between the first housing 210 and the second housing 220. For example, in the case of the intermediate state, the area, in which the hinge housing 310 is exposed to the outside, may be smaller than that of a fully folded state. According to an embodiment, the hinge housing 310 may include a curved-surface.

According to various embodiments, when the electronic device 200 is in an unfolded state (e.g., the state of FIG. 1A and FIG. 1B), the first housing 210 and the second housing 220 may form an angle of about 180 degrees, and a first area 230a, a second area 230b, a folding area 230c of the first display 230 may form the same flat surface and may be arranged to face substantially the same direction (e.g., the z-axis direction). In an embodiment, when the electronic device 200 is in an unfolded state, the first housing 210 may rotate at an angle of about 360 degrees with respect to the second housing 220, and thus the second surface 212 and the fourth surface 222 may be reversely folded to face each other (an out folding type).

According to various embodiments, when the electronic device 200 is in an unfolded state (e.g., the state of FIG. 2A and FIG. 2B), the first surface 211 of the first housing 210 and the third surface 221 of the second housing 220 may be arranged to face each other. In the case, the first area 230a and the second area 230b of the first display 230 may form a narrow angle (e.g., in the range of 0 degrees-about 10 degrees) by the folding area 230c, and may be arranged to face each other. According to an embodiment, at least a part of the folding area 230c may be deformed into a curved shape having a predetermined curvature. According to an embodiment, when the electronic device 200 is in an intermediate state, the first housing 210 and the second housing 220 may be arranged with a certain angle to each other. In the case, the first area 230a and the second area 230b of the first display 230 may form an angle larger than that of a folded state and smaller than that of an unfolded state, and the curvature of the folding area 230c may be smaller than that of a folded state and larger than that of an unfolded state. In various embodiments, the first housing 210 and the second housing 220, through the hinge device (e.g., the hinge device 320 of FIG. 3), may form an angle in which the first housing and the second housing can stop at a designated folding angle between a folded state and an unfolded state (a free stop function). In various embodiments, the first housing 210 and the second housing 220, through the hinge device (e.g., the hinge device 320 of FIG. 3), may continuously operate while being pressed in an unfolding direction or a folding direction with reference to a specific angle of inflection.

According to various embodiments, the electronic device 200 may include at least one of at least one display 230 and 300, an input device 215, a sound output device 227 and 228, a sensor module 217a, 217b, and 226, a camera module 216a, 216b, and 225, a key input device 219, an indicator (not shown), or a connector port 229, which are arranged in the first housing 210 and/or the second housing 220. In various embodiments, at least one of elements may be may omitted from the electronic device 200, or at least one another element may be additionally included therein.

According to various embodiments, the at least one display 230 and 300 may include the first display 230 (e.g., a flexible display) disposed to be supported by the third surface 221 of the second housing 220 from the first surface 211 of the first housing 210 through the hinge device (e.g., the hinge device 320 of FIG. 3), and the second display 300 disposed to be at least partially visible from the outside through the fourth surface 222 in the inner space of the second housing 220. In various embodiments, the second display 300 may be also disposed to be visible from the outside through the second surface 212 in the inner space of the first housing 210. According to an embodiment, the first display 230 may be mainly used in the unfolded state of the electronic device 200, and the second display 300 may be mainly used in the folded state of the electronic device 200. According to an embodiment, when the electronic device is in an intermediate state, the electronic device 200 may be configured to control such that the first display 230 and/or the second display 300 can be used based on a folding angle of the first housing 210 and the second housing 220.

According to various embodiments, the first display 230 may be disposed in an accommodation space formed by the one pair of housings 210 and 220. For example, the first display 200 may be disposed in the recess 201 formed by the one pair of housings 210 and 220, and in an unfolded state, may be disposed to occupy substantially most of the front surface of the electronic device 200. According to an embodiment, the first display 230 may include a flexible display of which at least a partial area may be deformed into a flat surface or a curved-surface. According to an embodiment, the first display 230 may include the first area 230a facing the first housing 210 and the second area 230b facing the second housing 220. According to an embodiment, the first display 230 may include the folding area 230c including a part of the first area 230a and a part of the second area 230c, with reference to the folding axis A. According to an embodiment, at least a part of the folding area 230c may include an area corresponding to the hinge device (e.g., the hinge device 320 of FIG. 3). According to an embodiment, the area division of the first display 230 may be merely an example physical division by the one pair of housings 210 and 220 and the hinge device (e.g., the hinge device 320 of FIG. 3), and substantially, the first display 230 may be used as a single full screen without a seam, through the one pair of housings 210 and 220 and the hinge device (e.g., the hinge device 320 of FIG. 3). According to an embodiment, the first area 230a and the second area 230b may have an overall symmetrical shape or a partially asymmetrical shape with reference to the folding area 230c.

According to various embodiments, the electronic device 200 may include a first rear cover 240 disposed on the second surface 212 of the first housing 210 and a second rear cover 250 disposed on the fourth surface 222 of the second housing 220. In various embodiments, at least a part of the first rear cover 240 may be integrally formed with the first side member 213. In various embodiments, at least a part of the second rear cover 250 may be integrally formed with the second side member 223. According to an embodiment, at least one cover among the first rear cover 240 and the second rear cover 250 may be formed of a substantially transparent plate (e.g., a glass plate including various coating layers, or a polymer plate) or an opaque plate. According to an embodiment, for example, the first rear cover 240 may be formed of coated or colored glass, ceramic, polymer, metal (e.g., aluminum, stainless steel (STS), or magnesium), or an opaque plate made of a combination of at least two of the materials. According to an embodiment, for example, the second rear cover 250 may be formed of a substantially transparent plate such as glass or polymer. Accordingly, the second display 300 may be disposed to be visible from the outside through the second rear cover 250, in the inner space of the second housing 220.

According to various embodiments, the input device 215 may include a microphone. In various embodiments, the input device 215 may include multiple microphones arranged to detect a direction of sound. According to an embodiment, the sound output device 227 and 228 may include speakers. According to an embodiment, the sound output device 227 and 228 may include a receiver 227 for a call, which is disposed through the fourth surface 222 of the second housing 220, and an external speaker 228 disposed through at least a part of the second side member 223 of the second housing 220. In various embodiments, the input device 215, the sound output device 227 and 228, and the connector 229 may be arranged in the space of the first housing 210 and/or the second housing 220, and may be exposed to the external environment through at least one hole which is formed through the first housing 210 and/or the second housing 220. In various embodiments, the holes formed through the first housing 210 and/or the second housing 220 may be commonly used for the input device 215 and the sound output device 227 and 228. In various embodiments, the sound output device 227 and 228 may include a speaker (e.g., a piezo speaker) which is operated without the hole formed through the first housing 210 and/or the second housing 220.

According to various embodiments, the camera module 216a, 216b, and 225 may include a first camera module 216a disposed on the first surface 211 of the first housing 210, a second camera module 261b disposed on the second surface 212 of the first housing 210, and/or a third camera module 225 disposed on the fourth surface 222 of the second housing 220. According to an embodiment, the electronic device 200 may include a flash 218 disposed near the second camera module 216b. According to an embodiment, for example, the flash 218 may include a light-emitting diode or a xenon lamp. According to an embodiment, the camera modules 216a, 216b, and 225 may include one or multiple lenses, an image sensor, and/or an image signal processor. In various embodiments, at least one camera module of the camera modules 216a, 216b, and 225 may include two or more lenses (e.g., a wide-angle and a telephoto lens) and image sensors, and may be arranged together on any one surface of the first housing 210 and/or the second housing 220.

According to various embodiments, the sensor module 217a, 217b, and 226 may generate electric signals or data values corresponding to an internal operation state of the electronic device 200 or an external environment state. According to an embodiment, the sensor modules 217a, 217b, and 226 may include a first sensor module 217a disposed on the first surface 211 of the first housing 210, a second sensor module 217b disposed on the second surface 212 of the first housing 210, and/or a third sensor module 226 disposed on the fourth surface 222 of the second housing 220. In various embodiments, the sensor module 217a, 217b, and 226 may include at least one of a gesture sensor, a grip sensor, a color sensor, an infrared (IR) sensor, an illumination sensor, an ultrasonic sensor, an iris recognition sensor, or a distance detection sensor (e.g., a time of flight (TOF), or light detection and ranging (LiDAR).

According to various embodiments, the electronic device 200 may further include a sensor module illustrated therein, for example, at least one of a barometric pressure sensor, a magnetic sensor, a biometric sensor, a temperature sensor, a humidity sensor, or a fingerprint recognition sensor. In various embodiments, the fingerprint recognition sensor may be disposed through at least one side member of the first side member 213 of the first housing 210 and/or the second side member 223 of the second housing 220.

According to various embodiments, the key input device 219 may be disposed to be exposed to the outside through the first side member 213 of the first housing 210. In various embodiments, the key input device 219 may be disposed to be exposed to the outside through the second side member 223 of the second housing 220. In various embodiments, the electronic device 200 may not include some or all of the key input devices 219, and the key input device 219 included therein may be implemented in another form such as a soft key on the at least one display 230 and 300. In an embodiment, the key input device 219 may be implemented using a pressure sensor included in the at least one display 230 and 300.

According to various embodiments, the connector port 229 may include a connector (e.g., a USB connector or an interface connector port module (IF module)) for transmitting or receiving power and/or data to or from an external electronic device. In various embodiments, the connector port 229 may also further include a separate connector port (e.g., an ear jack hole) configured to perform a function for transmitting or receiving an audio signal to or from an external electronic device together, or to perform a function for transmitting or receiving an audio signal.

According to various embodiments, at least one camera module 216a and 225 of the camera modules 216a, 216b, and 225, at least one sensor module 217a and 226 of the sensor modules 217a, 217b, and 226, and/or the indicator may be arranged to be exposed through the at least one display 230 and 300. For example, the at least one camera module 216a and 225, the at least one sensor module 217a and 226, and/or the indicator, in the inner space of at least one of the housings 210 and 220, may be arranged under an active area (a display area) of the at least one display 230 and 300, and may be arranged to be in contact with an external environment through an opening perforated up to a cover member (e.g., a window layer (not shown) of the first display 230 and/or the second rear cover 250) or a transparent area. According to an embodiment, an area, in which the at least one display 230 and 300 and the at least one camera module 216a and 225 face each other, may be a part of an area on which a content is displayed, and may be formed as a transmittance area having a predetermined transmissivity. According to an embodiment, the transmission area may be formed to have a transmissivity in the range of about 5%-about 20%. The transmittance area may include an area overlapping an effective area (e.g., a view angle area) of the at least one camera module 216a or 225, through which light for generating an image, which is imaged by an image sensor, passes. For example, the transmittance area of the display 230 and 300 may include an area having a pixel density lower than the perimeter area thereof. For example, the transmittance area may replace the opening. For example, the at least one camera module 216a and 225 may include an under-display camera (UDC) or an under-panel camera (UPC). In an embodiment, some camera modules or the sensor module 217a and 226 may be arranged to perform their functions without being visually exposed through a display. For example, the area facing the camera module 216a and 225 and/or the sensor module 217a and 226, which are arranged under the display 230 and 300 (e.g., a display panel), may be an under-display camera (UDC) structure, and may not need a perforated opening.

FIG. 3 is an exploded perspective view of an electronic device 200 according to various embodiment.

Referring to FIG. 3, the electronic device 200 may include the first display 230 (e.g., a flexible display), the second display 300, the hinge device 320, one pair of support members 261 and 262, at least one substrate 270 (e.g., a printed circuit board (PCB)), the first housing 210, the second housing 220, the first rear cover 240, and/or the second rear cover 250.

According to various embodiments, the first display 230 may include a display panel 430 (e.g., a flexible display panel), a support plate 450 disposed under the display panel 430, and one pair of reinforced plates 461 and 462 disposed under the support plate 450. According to an embodiment, the display panel 430 may include a first panel area 430a configured to correspond to the first area (e.g., the first area 230a of FIG. 1A) of the first display 230, a second panel area 430b configured to extend from the first panel area 430a and correspond to the second area (e.g., the second area 230b of FIG. 1A) of the first display 230, and a third panel area 430c configured to connect the first panel area 430a and the second panel area 430b and correspond to the folding area (e.g., the folding area 230c of FIG. 1A) of the first display 230. According to an embodiment, the support plate 450 may be disposed between the display panel 430 and the one pair of support members 261 and 262, and may be formed of a material and a shape which is configured to provide a planar support structure for the first panel area 430a and the second panel area 430b and a bendable structure for helping flexibility of the third panel area 430c. According to an embodiment, the support plate 450 may be formed of a conductive material (e.g., metal) or a non-conductive material (e.g., polymer or fiber reinforced plastics (FRP)). According to an embodiment, the one pair of reinforced plates 461 and 462, between the support plate 450 and the one pair of support members 261 and 262, may include a first reinforced plate 461 disposed to correspond to at least a part of the first panel area 430a and the third panel area 430c, and a second panel area 430b disposed to correspond to at least a part of the second panel area 430b and the third panel area 430c. According to an embodiment, the one pair of reinforced plates 461 and 462 may be formed of a metal material (e.g., SUS) to help a ground connection structure and rigidity reinforcement in order for the first display 230.

According to various embodiments, the second display 300 may be disposed in the space between the second housing 220 and the second rear cover 250. According to an embodiment, the second display 300 may be disposed to be visible from the outside through substantially the entire area of the second rear cover 250 in the space between the second housing 220 and the second rear cover 250.

According to various embodiments, at least a part of the first support member 261 may be foldably coupled to the second support member 262 through the hinge device 320. According to an embodiment, the electronic device 200 may include at least one wiring member 263 (e.g., a flexible circuit board (FPCB)) which is disposed from at least a part of the first support member 261 across the hinge device 320 to a part of the second support member 262. According to an embodiment, the first support member 261 may be configured to extend from the first side member 213 or may be disposed in a manner in which same is structurally coupled to the first side member 213. According to an embodiment, the electronic device 200 may include the first space (e.g., the first space 2101 of FIG. 1A) provided through the first support member 261 and the first rear cover 240. According to an embodiment, the first housing 210 (e.g., a first housing structure) may be configured through the coupling of the first side member 213, the first support member 261, and the first rear cover 240. According to an embodiment, the second support member 262 may be configured to extend from the second side member 223 or may be disposed in a manner in which same is structurally coupled to the second side member 223. According to an embodiment, the electronic device 200 may include the second space (e.g., the second space 2201 of FIG. 1A) provided through the second support member 262 and the second rear cover 250. According to an embodiment, the second housing 220 (e.g., a second housing structure) may be configured through the coupling of the second side member 223, the second support member 262, and the second rear cover 250. According to an embodiment, the at least one wiring member 263 and/or at least a part of the hinge device 320 may be arranged to be supported through at least a part of the one pair of support members 261 and 262. According to an embodiment, the at least one wiring member 263 may be disposed in a direction (e.g., the x-axis direction) crossing the first support member 261 and the second support member 262. According to an embodiment, the at least one wiring member 263 may be disposed in a direction (e.g., the x-axis direction) which is substantially perpendicular to the folding axis (e.g., the y-axis or the folding axis A of FIG. 1A).

According to various embodiments, the at least one substrate 270 may include a first substrate 271 disposed in the first space 2101 and a second substrate 272 disposed in the second space 2201. According to an embodiment, the first substrate 271 and the second substrate 272 may include multiple electronic components arranged to implement various functions of the electronic device 200. According to an embodiment, the first substrate 271 and the second substrate 272 may be electrically connected through the at least one wiring member 263.

According to various embodiments, the electronic device 200 may include at least one battery 291 and 292. According to an embodiment, the at least one battery 291 and 292 may include a first battery 291 disposed in the first space 2101 of the first housing 210 and electrically connected to the first substrate 271, and a second battery disposed in the second space 2201 of the second housing 220 and electrically connected to the second substrate 272. According to an embodiment, the first support member 261 and the second support member 262 may further include at least one swelling hole for the first battery 291 and the second battery 292.

According to various embodiments, the first housing 210 may include a first rotation support surface 214, and the second housing 220 may include a second rotation support surface 224 corresponding to the first rotation support surface 214. According to an embodiment, the first rotation support surface 214 and the second rotation support surface 224 may include a curved-surface corresponding to (naturally connected to) a curve-shaped outer surface of the hinge housing 310. According to an embodiment, when the electronic device 200 is in an unfolded state, the first rotation support surface 214 and the second rotation support surface 224 may cover the hinge housing 310, such that the hinge housing 310 does not expose to the rear surface of the electronic device 200 or only a part of the hinge housing is exposed. According to an embodiment, when the electronic device 200 is in a folded state, the first rotation support surface 214 and the second rotation support surface 224 may be configured such that the hinge housing 310 having a curved shape rotates along outer surfaces thereof, and thus at least a part of the hinge housing 310 may be exposed to the rear surface of the electronic device 200.

According to various embodiments, the electronic device 200 may include at least one antenna 276 disposed in the first space 2201. According to an embodiment, the at least one antenna 276 may be disposed on the first battery 291 and the first rear cover 240, in the first space 2201. According to an embodiment, for example, the at least one antenna 276 may include a near field communication (NFC) antenna, a wireless charging antenna, and/or a magnetic secure transmission (MST) antenna. According to an embodiment, for example, the at least one antenna 276 may be configured to perform short-range communication with an external device or wirelessly transmit and receive power required for charging. In various embodiments, an antenna structure may be formed by at least a part of the first side member 213 or the second side member 223 and/or a part or a combination of the first support member 261 and the second support member 262.

According to various embodiments, the electronic device 200 may further include at least one electronic component assembly 274 and 275 and/or additional support members 263 and 273, which are arranged in the first space 2101 and/or the second space 2201. For example, the at least one electronic component assembly may include an interface connector port assembly 274 or a speaker assembly 275.

According to various embodiments, the electronic device 100 may include a first waterproof structure WP1 disposed between the first reinforced plate 461 and the first 261, and a second waterproof structure WP2 disposed between a second reinforced plate 462 and the second support member 262. According to an embodiment, the first waterproof structure WP1, between the first reinforced plate 461 and the first support member 261, may include a first waterproof member 481 disposed to allow at least one first waterproof space 4811, 4812, and 4813 to be formed therein. According to an embodiment, the second waterproof structure WP2, between the second reinforced plate 462 and the second support member 262, may include a second waterproof member 482, a third waterproof member 483, and a fourth waterproof member 484, which are arranged to allow at least one second waterproof space 4821 to be formed therein. According to an embodiment, the fourth waterproof member 484 may be disposed to connect spaces of the second waterproof member 482 and the third waterproof member 483, which are stepped and spaced apart from each other.

According to various embodiments, the at least one first waterproof space 4811 may be disposed to accommodate a through-path of an FPCB connection part (e.g., the first FPCB connection part 4711 of FIG. 6) which is a wiring structure configured to connect an electronic component (e.g., the first digitizer panel 471 of FIG. 4) disposed between the first reinforced plate 461 and the first support member 262 to the first space 2101 through the first waterproof member 481. According to various embodiments, the at least one second waterproof space 4821 may be disposed to accommodate a through-path of an FPCB connection part (e.g., the second FPCB connection part 4721 of FIG. 6) which is a wiring structure configured to connect an electronic component (e.g., the second digitizer panel 472 of FIG. 4) disposed between the second reinforced plate 462 and the second support member 262 to the second space 2201 through the second waterproof member 482, the third waterproof member 483, and the fourth waterproof member 484. According to an embodiment, at least one first waterproof space 4812 and 4813 may be configured to accommodate an area corresponding to at least one electronic component (e.g., a camera module or a sensor module) disposed to be supported by the first support member 261. According to an embodiment, the at least one second waterproof space 4821 may be configured to accommodate at least a part of a bending part (e.g., the bending part 432 of FIG. 4) which is folded to the rear surface of the first display 230. For example, the at least one second waterproof space 4821 may be configured to extend from the display panel (e.g., the display panel 430 of FIG. 4) of the first display 230 and may be disposed to surround at least a part of the bending part 432 folded to the rear surface thereof. Accordingly, a control circuit (e.g., the control circuit 4321*a* of FIG. 4) and multiple electrical elements (not shown), which are arranged in the bending part 432, may be disposed in the at least one second waterproof space 4821, and thus can be protected from external moisture and/or foreign materials.

According to various embodiments, the electronic device 200 may include a waterproof tape 241 disposed between the first rear cover 240 and the first housing 210. According to various embodiments, the electronic device 200 may include a bonding member 251 disposed between the second rear cover 250 and the second housing 220. In various embodiments, the bonding member 251 may be disposed between the second display 300 and the second housing 220 also. In various embodiments, the waterproof tape 241 may be replaced with the bonding member 251, and the bonding member 251 may be replaced with the waterproof tape 241.

According to the electronic device 200 according to an example embodiment of the disclosure, the at least one waterproof member 481, 482, 483, and 484 may include the at least one waterproof structure WP1 and WP2 which is disposed between the first support member 261 and the first reinforced plate 461 of the first housing 210 and/or the second support member 262 and the second reinforced plate 462 of the second housing 220. Therefore, when the first display 230 is separated from the housings 210 and 220 in order for maintenance of the electronic device 200, damage of the first display can be reduced by the waterproof member. In addition, the at least one waterproof member 481, 482, 483, and 484 may be arranged to avoid the rear surface of the first display 230, to improve external visibility and to secure surface quality.

Figure 4:
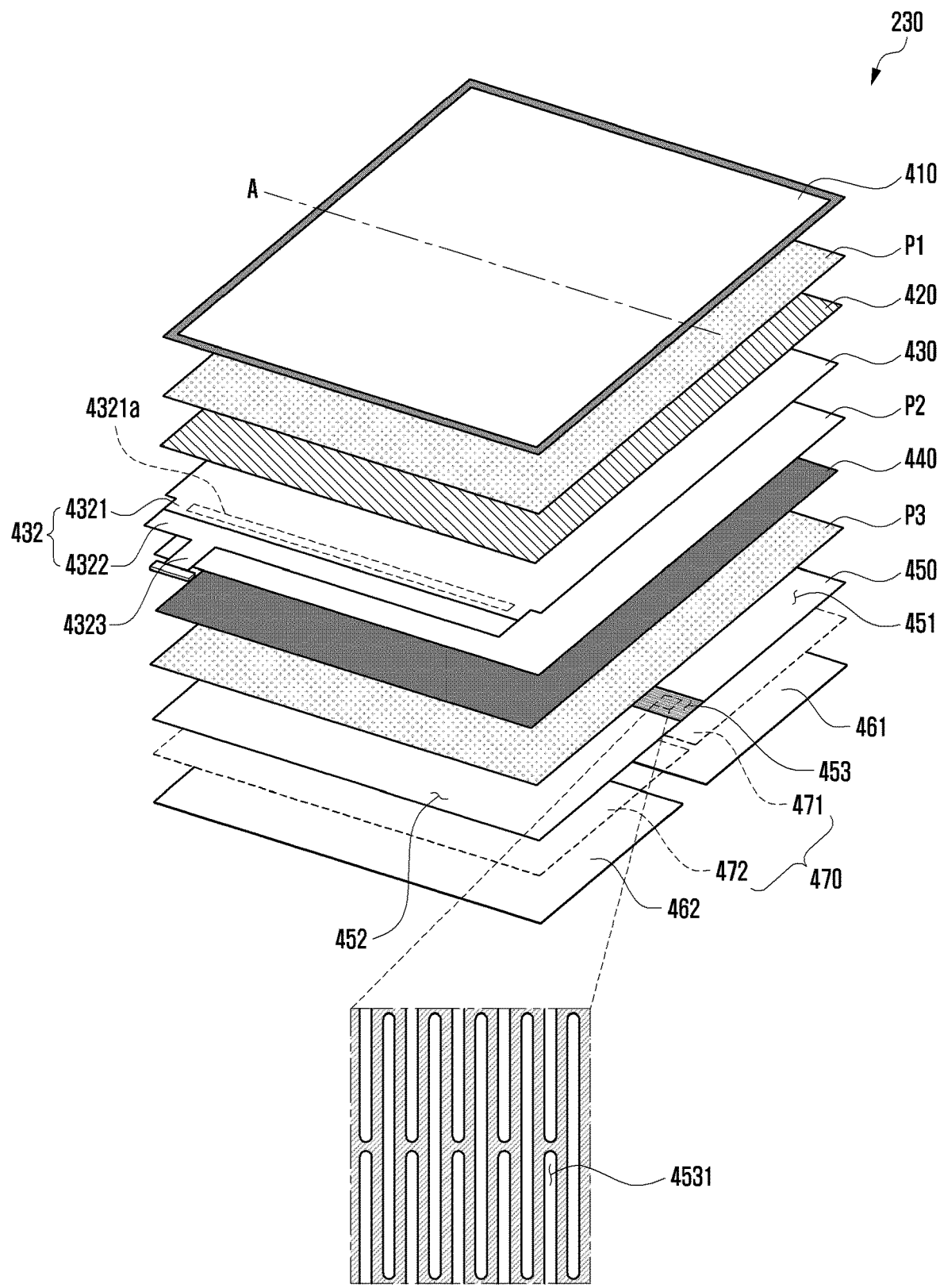
FIG. 4 is an exploded perspective view of a first display according to various embodiments.

FIG. 4 is an exploded perspective view of a display module according to various embodiments. The display module of FIG. 4 may be an example of the first display (e.g., the first display 230 of FIG. 1A and FIG. 3) illustrated in FIG. 1A and FIG. 3 above.

The flexible display module 230 according to various example embodiments of the disclosure may include an unbreakable (UB) type OLED display (e.g., a curved display). However, it may not be limited thereto, and the flexible display module 230 may include a flat type display having an on-cell touch active matrix organic light-emitting diode (AMOLED) (OCTA) manner.

Referring to FIG. 4, the flexible display module 230 may include a window layer 410, and a polarizer (POL) 420 (e.g., a polarization film), a display panel 430, a polymer layer 440, a support plate 450, and reinforced plates 461 and 462, which are sequentially arranged on the rear surface (e.g., the −z-axis direction) of the window layer 410. In various embodiments, the flexible display module 230 may include a digitizer panel 470 disposed between the support plate 450 and the reinforced plates 461 and 462. In various embodiments, the digitizer panel 470 may be also disposed between the polymer layer 440 and the support plate 450.

According to various embodiments, the window layer 410 may include a glass layer. According to an embodiment, the window layer 410 may include an ultra-thin glass (UTG). In various embodiments, the window layer 410 may include polymer. In the case, the window layer 410 may include polyethylene terephthalate (PET) or polyimide (PI). In various embodiments, the window layer 410 may be disposed in multiple layers to include a glass layer and polymer.

According to various embodiments, the window layer 410, the polarizer 420, the display panel 430, the polymer layer 440, and the support plate 450 may be arranged to cross at least a part of a first surface (e.g., the first surface 211 of FIG. 1A) of the first housing (e.g., the first housing 210 of FIG. 1A) and a third surface (e.g., the third surface 221 of FIG. 1A) of the second housing (e.g., the second housing 220 of FIG. 1A). According to an embodiment, the reinforced plates 461 and 462 may include a first reinforced plate 461 corresponding to the first housing (e.g., the first housing 210 of FIG. 1A) and a second reinforced plate 462 corresponding to the second housing (e.g., the second housing 220 of FIG. 1A). According to an embodiment, the reinforced plates 461 and 462 may provide rigidity for the flexible display module 230, and may be used as a ground for preventing and/or reducing malfunction of the flexible display module 230. According to an embodiment, the reinforced plates 461 and 462 may be formed of a metal material. According to an embodiment, the reinforced plates 461 and 462 may be formed of SUS or AL. According to an embodiment, the window layer 410, the polarizer 420, the display panel 430, the polymer layer 440, the support plate 450, and the reinforced plates 461 and 462 may be adhered to each other through an adhesive material P1, P2, and P3 (or an adhesive). For example, the adhesive material P1, P2, and P3 may include at least one of an optical clear adhesive (OCA), a pressure sensitive adhesive (PSA), a heat responsive adhesive, a general adhesive, and a double-sided tape.

According to various embodiments, the display panel 430 may include multiple pixels and a wiring structure (e.g., an electrode pattern). According to an embodiment, the polarizer 420 may be configured to allow light, which is generated from a light source of the display panel 430 and vibrates in a predetermined direction, to selectively pass therethrough. According to an embodiment, the display panel 430 and the polarizer 420 may be integrally formed. According to an embodiment, the flexible display module 230 may include a touch panel (not shown).

According to various embodiments, the polymer layer 440 may be disposed under the display panel 430 to provide a dark background for securing visibility of the display panel 430, and may be made of a buffer material for a buffer function. In various embodiments, in order for waterproofing of the flexible display module 230, the polymer layer 440 may be removed or disposed under the support plate 450.

According to various embodiments, the support plate 450 may provide a flexural characteristic to the flexible display module 230. For example, the support plate 450 may be made of a non-metal thin plate-shaped material such as fiber reinforced plastics (FRP) (e.g., carbon fiber reinforced plastics (CFRP) or glass fiber reinforced plastics (GFRP)) having a rigid characteristic for supporting the display panel 430. According to an embodiment, the support plate 450 may include a first flat surface part 451 corresponding to the first housing (e.g., the first housing 210 of FIG. 1A), a second flat surface part 452 corresponding to the second housing (e.g., the second housing 220 of FIG. 1A), and a bending part 453 (a flexible portion or a bending portion) configured to connect the first flat surface part 451 and the second flat surface part 452. According to an embodiment, the bending part 453 may include multiple openings 4531 arranged at designated intervals. According to an embodiment, the flexural characteristic of the bending part 453 may be determined based on at least one of the sizes of at least some of multiple openings 4531, the shape thereof, or an arrangement density thereof. In various embodiments, the support plate 450 may be made of a metal material such as steel use stainless (SUS) (e.g., stainless steel (STS)), Cu, Al, or metal CLAD (e.g., a stacking member in which SUS and Al are alternately arranged). In this case, the support plate 450 may have the multiple openings which are formed over the entire area thereof so as to be induced detection of the digitizer panel 470 disposed therebelow. According to an embodiment, the support plate 450 may be used in order to help rigidity reinforcement of an electronic device (e.g., the electronic device 200 of FIG. 1A), shield ambient noise, and disperse heat emitted from a heat-emitting component therearound.

According to various embodiments, the display 230 may include the digitizer panel 470 which is disposed under the support plate 450 and is a detection member configured to receive an input of an electronic pen (e.g., a stylus). According to an embodiment, the digitizer panel 470 may include coil members arranged on a dielectric substrate (e.g., a dielectric film or a dielectric sheet) to detect a resonance frequency of an electromagnetic induction type, which is applied from the electronic pen. According to an embodiment, the digitizer panel 470 may include a first digitizer panel 471 corresponding to the first housing (e.g., the first housing 210 of FIG. 1A) and a second digitizer panel 472 corresponding to the second housing (e.g., the second housing 220 of FIG. 1A). According to an embodiment, each of the first digitizer panel 471 and the second digitizer panel 472 may be electrically connected to substrates (e.g., the substrates 271 and 272 of FIG. 3) of the electronic device (e.g., the electronic device 200 of FIG. 3) through an FPCB connection part (e.g., the first FPCB connection part 4711 and the second FPCB connection part 4721 of FIG. 6), and thus may be operated as one digitizer panel. In various embodiments, the first digitizer panel 471 and the second digitizer panel 472 may operate individually.

According to various embodiments, the flexible display module 230 may include at least one functional member (not shown) disposed between the polymer layer 440 and the support plate 450 or under the support plate 450. According to an embodiment, the functional member may include a graphite sheet for heat dissipation, an added display, a force touch FPCB, a fingerprint sensor FPCB, an antenna radiator for communication, or a conductive/non-conductive tape. According to an embodiment, when bending thereof is impossible, the functional member may be separately disposed in the first housing (e.g., the first housing 210 of FIG. 1A) and in the second housing (e.g., the second housing 220 of FIG. 1A). According to an embodiment, when bending thereof is possible, the functional member may be disposed from the first housing (e.g., the first housing 210 of FIG. 1A) to at least a part of the second housing (e.g., the second housing 220 of FIG. 1A) through the hinge device (e.g., the hinge device 320 of FIG. 3).

According to various embodiments, the flexible display module 230 may include the bending part 432 disposed in a manner in which the bending part is folded from the display panel 430 to at least a partial area of the rear surface (e.g., the −z-axis direction) of the flexible display module 230. According to an embodiment, the bending part 432 may include an extension part 4321 extending from the display panel 430 and including a control circuit 4321*a*, and a flexible substrate 4322 which is electrically connected to the extension part 4321 and includes multiple electrical elements. According to an embodiment, the control circuit 4321*a* may include a display driver IC (DDI) or a touch display driver IC (TDDI) mounted on the extension part 4321 having an electrical wiring structure. According to an embodiment, the bending part 432 may include a chip on panel or chip on plastic (COP) structure in which the control circuit 4321*a* is directly disposed on the extension part 4321. In various embodiments, the bending part 432 may also include a chip on film (COF) structure in which the control circuit 4321*a* is mounted on a separate connecting film (not shown) configured to connect the extension part 4321 and the flexible substrate 4322. According to an embodiment, the flexible display module 230 may include an FPCB connection part 4323 configured to extend from the flexible substrate 4322 and electrically connected to a substrate (e.g., the second substrate 272 of FIG. 3) of the electronic device (e.g., the electronic device 200 of FIG. 3). According to an embodiment, multiple electrical elements may include a passive element such as a touch IC, a flash memory for a display, a diode for ESD prevention/reduction, a pressure sensor, a fingerprint sensor, or a decap. In an embodiment, when the bending part 432 is disposed in an area facing the first housing (e.g., the first housing 210 of FIG. 1A) of the flexible display module 230, the FPCB connection part 4323 may be electrically connected to another substrate (e.g., the first substrate 271 of FIG. 3) of the electronic device (e.g., the electronic device 200 of FIG. 3).

According to various example embodiments of the disclosure, the electronic device (e.g., the electronic device 200 of FIG. 3) may include a wiring structure of an FPCB connection part (e.g., the FPCB connection parts 4711 and 4721 of FIG. 6) withdrawn from the digitizer panel 470 disposed on the rear surface of the flexible display module 230, and a waterproof structure provided to protect, from external moisture and/or foreign materials, the areas corresponding to at least one electronic component (e.g., a camera module or a sensor module) disposed through at least a part (e.g., the extension part 4321) of the bending part 432 which is bent to the rear surface of the flexible display module 230 and includes the control circuit 4321*a* and multiple electrical elements, and disposed through the support members 461 and 462.

Hereinafter, the waterproof structure provided to an electronic device will be described in greater detail with reference to the drawings.

Figure 5:
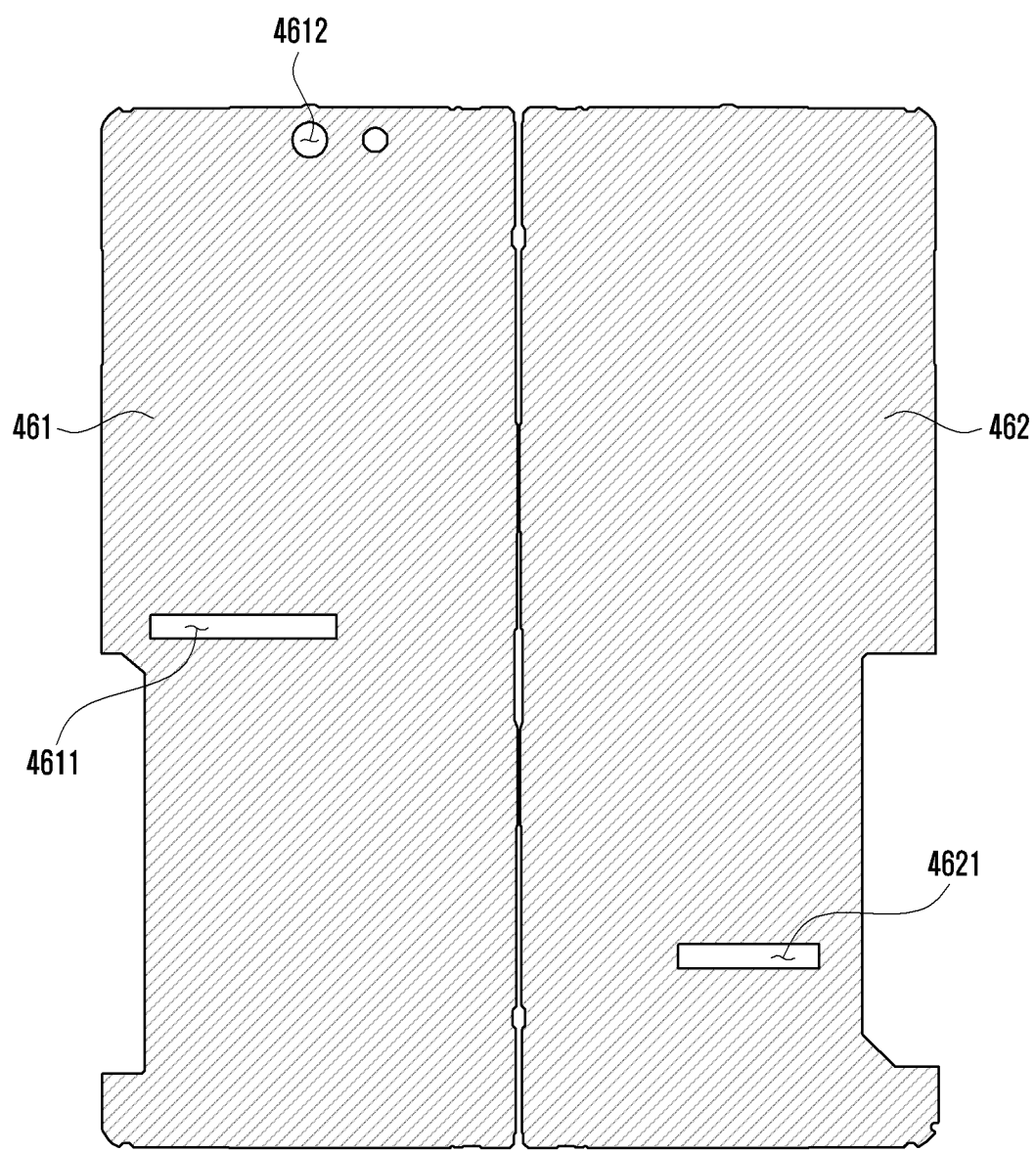
FIG. 5 is a diagram illustrating example reinforced plates according to various embodiments.
Figure 6:
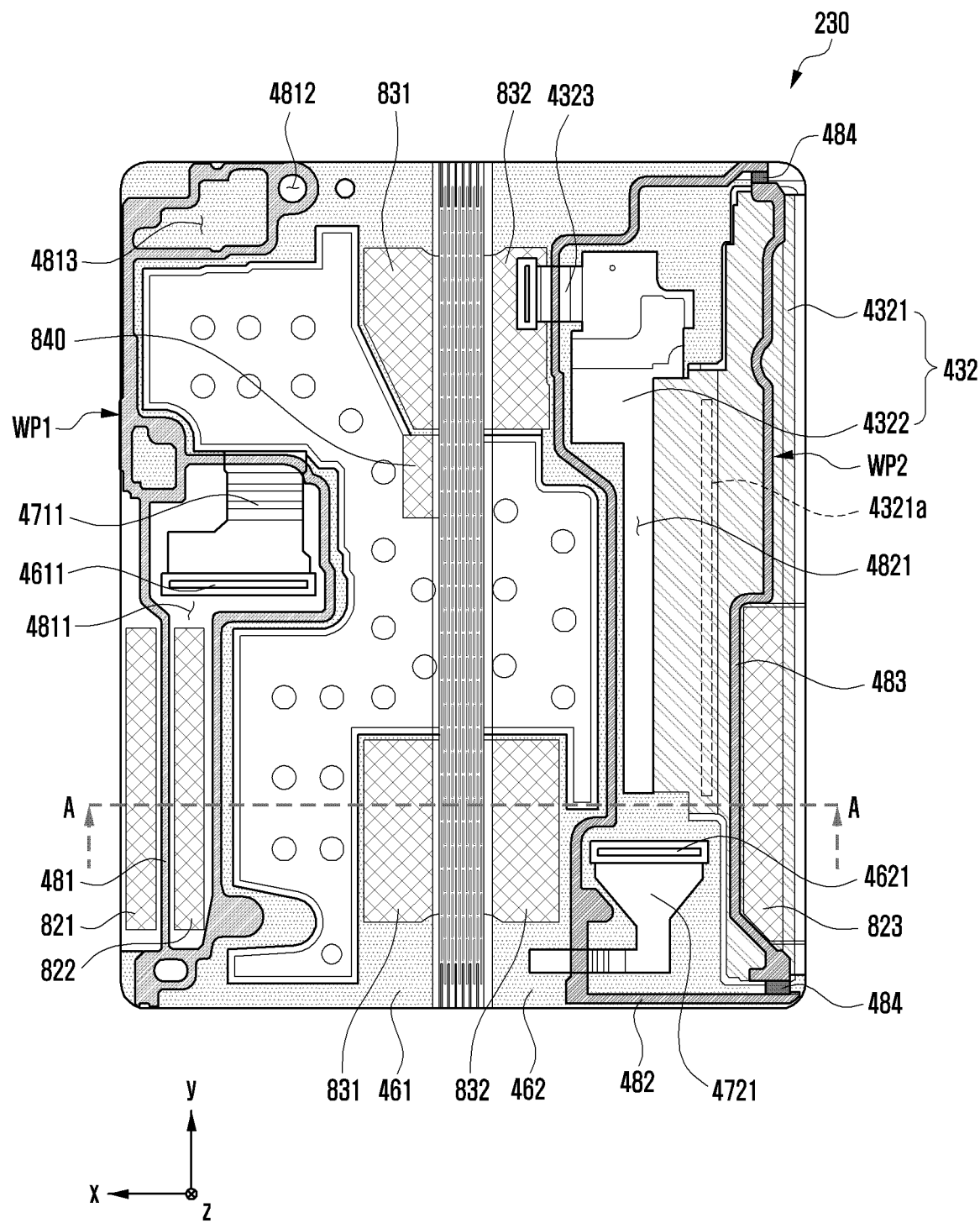
FIG. 6 is a diagram illustrating a rear surface structure of a flexible display according to various embodiments.

FIG. 5 is a diagram illustrating example reinforced plates according to various embodiment. FIG. 6 is a diagram illustrating a rear surface structure of a flexible display module according to various embodiments.

FIG. 5 and FIG. 6 are views of reinforced plates 461 and 462 and a flexible display 230 seen when an electronic device (e.g., the electronic device 200 of FIG. 1B) is seen from the rear direction (e.g., when seen in the state of FIG. 1B).

Referring to FIG. 5 and FIG. 6, the electronic device (e.g., the electronic device 200 of FIG. 3) may include the first reinforced plate 461 corresponding to the first housing (e.g., the first housing 210 of FIG. 1A) and the second reinforced plate 462 corresponding to the second housing (e.g., the second housing 220 of FIG. 1A). According to an embodiment, a first digitizer panel (e.g., the first digitizer panel 471 of FIG. 4) may be disposed between the support plate (e.g., the support plate 450 of FIG. 4) and the first reinforced plate 461, and the first FPCB connection part 4711 of the first digitizer panel 471 may be electrically connected to a substrate (e.g., the first substrate 271 of FIG. 3) disposed in the first space (e.g., the first space 2101 of FIG. 1A) of the first housing (e.g., the first housing 210 of FIG. 1A) through the first reinforced plate 461. Accordingly, the first reinforced plate 461 may include a first through-hole 4611 through which the first FPCB connection part 4711 extends. According to an embodiment, a second digitizer panel (e.g., the second digitizer panel 472 of FIG. 4) may be also disposed between the support plate (e.g., the support plate 450 of FIG. 4) and the second reinforced plate 462, and the second FPCB connection part 4721 of the second digitizer panel 472 may be electrically connected to a substrate (e.g., the second substrate 272 of FIG. 3) disposed in a second space (e.g., the second space 2201 of FIG. 1A) of the second housing (e.g., the second housing 220 of FIG. 1A) through the second reinforced plate 462. Accordingly, the second reinforced plate 462 may include a second through-hole 4621 through which the second FPCB connection part 4721 extends. According to an embodiment, the first reinforced plate 461 may include at least one hole 4612 for at least one electronic component (e.g., a camera module or a sensor module) arranged to be supported by the first support member (e.g., the first support member 261 of FIG. 3). For example, at least one electronic component may be disposed to correspond to the at least one hole 4612, so as to detect an external environment through the flexible display 230.

According to various embodiments, the electronic device (e.g., the electronic device 200 of FIG. 3) may include the first waterproof structure WP1 disposed between the first reinforced plate 461 and the first support member (e.g., the first support member 261 of FIG. 3) of the first housing (e.g., the first housing 210 of FIG. 3), and the second waterproof structure WP2 disposed between the second reinforced plate 462 and the second support member (e.g., the second support member 262 of FIG. 3) of the second housing (e.g., the second housing 220 of FIG. 3). According to an embodiment, the first waterproof structure WP1 may include at least one first waterproof space 4811, 4812, and 4813 formed through the first waterproof member 481. According to an embodiment, the first waterproof member 481 may include at least one of a tape, an adhesive, a waterproof dispensing, silicone, a waterproof rubber, and urethane. According to an embodiment, at least one first waterproof space 4811 may include the first waterproof space 4811 having a closed loop shape, the second waterproof space 4812 which is spaced apart from the first waterproof space 4811 and has a closed loop shape, and the third waterproof space 4813 which is spaced apart from the second waterproof space 4812 and has a closed loop shape. According to an embodiment, when the first reinforced plate 461 is seen from above, the first through-hole 4611 may be disposed at a position which at least partially overlaps the first waterproof space 4811. According to an embodiment, when the first reinforced plate 461 is seen from above, the first through-hole 4612 may be disposed at a position which overlaps at least a part of the second waterproof space 4812. The third waterproof space 4813 may be disposed at a position where at least one electronic component (e.g., a sensor module) overlaps.

According to various embodiments, the second waterproof structure WP2 may include the fourth waterproof space 4821 which is formed through a (2-1)st waterproof member 482, a (2-2)nd waterproof member 483, and a (2-3)rd waterproof member 484 and has a closed loop shape. According to an embodiment, when the second reinforced plate 462 is seen from above, the second through-hole 4621 may be disposed at a position which overlaps at least a part of the fourth waterproof space 4821. According to an embodiment, the fourth waterproof space 4821, between the second reinforced plate 462 and the second support member 262, may be formed through the (2-1)st waterproof member 482 disposed to surround at least a part of the bending part 432, the (2-2)nd waterproof member 483 disposed between the extension part 4321 and the second support member 262, and the (2-3)rd waterproof member 484 configured to connect the (2-1)st waterproof member 482 and the (2-2)nd waterproof member 483. According to an embodiment, the (2-1)st waterproof member 482 and the (2-2)nd waterproof member 483 may include at least one of a tape, an adhesive, a waterproof dispensing, silicone, a waterproof rubber, and urethane. According to an embodiment, when the (2-1)st waterproof member 482 and the (2-2)nd waterproof member 483 are integrally formed, moisture or foreign materials may be introduced into the gap formed by a height difference (a step difference) between the bending part 432 and the second reinforced plate 462. According to an embodiment, the (2-1)st waterproof member 482 may be attached thereto in a state where the (2-1)st waterproof member is separated to be spaced apart from the (2-2)nd waterproof member 483 by a predetermined interval at the above-mentioned step difference part, and the step difference part including the corresponding interval may be connected without a gap through the (2-3)rd waterproof member 484. According to an embodiment, the (2-3)rd waterproof member 484 may include cured-in place gaskets (CIPG) (e.g., a waterproof filling member) which includes a semi-solid or a liquid substance and thus has the property solidified under natural or external conditions (e.g., heat, ultraviolet rays, moisture, or pressure).

According to various embodiments, when the second reinforced plate 462 is seen from above, the second through-hole 4621 may be disposed at a position which overlaps at least a part of the fourth waterproof space 4821. According to an embodiment, the flexible display 230 may include a third FPCB connection part 4323 configured to extend from the flexible substrate 4322 of the bending part 432. According to an embodiment, the third FPCB connection part 4323 may be electrically connected to a substrate (e.g., the second substrate 272 of FIG. 3) disposed in the second space (e.g., the second space 2201 of FIG. 1A) through the second support member 262. According to an embodiment, when the second reinforced plate 262 is seen from above, the area, in which the third FPCB connection part 4323 is disposed, may be also disposed in an area overlapping at least a part of the fourth space 4821. Therefore, the second through-hole 4621 and the third FPCB connection part 4323 may be positioned in the fourth waterproof space 4821 having a closed loop shape, to prevent and/or reduce ingress of moisture and foreign materials.

Figure 7:
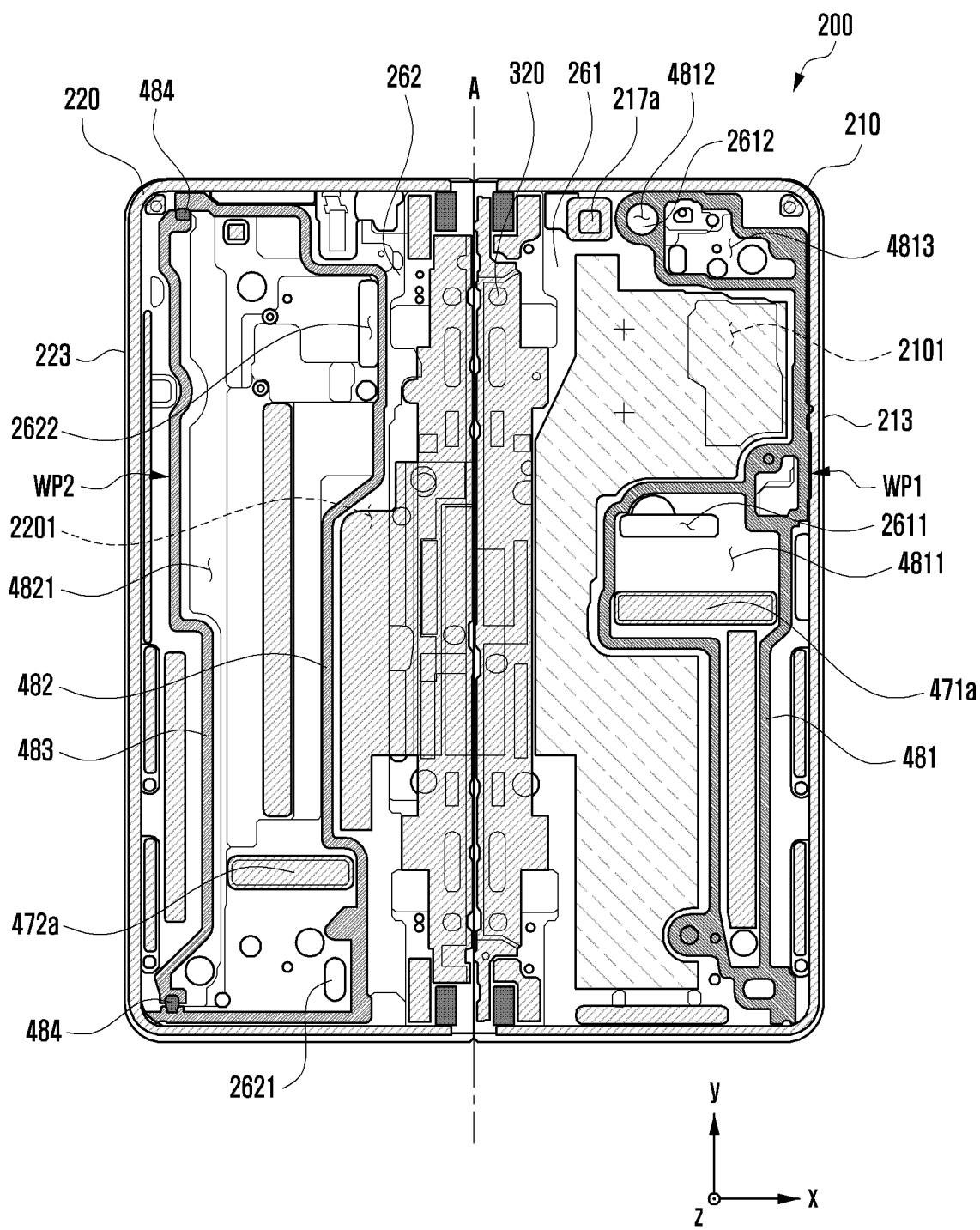
FIG. 7 is a diagram illustrating an unfolded state of an electronic device in a state where a flexible display is omitted according to various embodiments.

FIG. 7 is a diagram illustrating an unfolded state of a foldable electronic device in a state where a flexible display is omitted according to various embodiments.

FIG. 7 is a view of housings 210 and 220 seen when an electronic device (e.g., the electronic device 200 of FIG. 1A) is seen from the direction of the front surface thereof (e.g., when seen in the state of FIG. 1B).

Referring to FIG. 5 to FIG. 7 (e.g., FIGS. 5, 6 and 7), the electronic device 200 may include the first housing 210 and the second housing 220 foldably connected to the first housing 210 through the hinge device (e.g., the hinge device 320 of FIG. 3). According to an embodiment, the first housing 210 may include the first side member 213 configured to form at least a part of the side surface of the electronic device 210, and the first support member 261 configured to extend from the first side member 213 to the first space 2101. According to an embodiment, the second housing 220 may include the second side member 223 configured to form at least a part of the side surface of the electronic device 200, and the second support member 262 configured to extend from the second side member 223 to the second space 2201. According to an embodiment, the first support member 261 and the second support member 262 may be formed as a substantially flat surface to support the flexible display module 230 of FIG. 6. According to an embodiment, when the flexible display module 230 is coupled to be supported through the first housing 210 and the second housing 220, the first reinforced plate 461 may face at least a part of the first support member 261, and the second reinforced plate 462 may be disposed to face at least a part of the second support member 262.

According to various embodiments, the first support member 261 may include a first member through-hole 2611 connected from the outer surface thereof to the first space 2201. According to an embodiment, when the flexible display module 230 is disposed, the first FPCB connection part 4711 of the first digitizer panel 471, which is withdrawn from the first through-hole 4611 of the first reinforced plate 461, may be electrically connected to the first substrate (e.g., the first substrate 271 of FIG. 3) disposed in the first space 2101 of the first housing 210 through the first member through-hole 2611 formed through the first support member 261. According to an embodiment, when the flexible display module 230 is disposed, the second FPCB connection part 4721 of the second digitizer panel 472, which is withdrawn from the second through-hole 4621 of the second reinforced plate 462, may be electrically connected to the second substrate (e.g., the second substrate 272 of FIG. 3) disposed in the second space 2201 of the second housing 220 through the second member through-hole 4621 formed through the second support member 262. According to an embodiment, the third FPCB connection part 4323, which is disposed on the rear surface of the flexible display module 230 in a folding manner and connected to the flexible substrate 4322, may be electrically connected to the second substrate (e.g., the second substrate 272 of FIG. 3) disposed in the second space 4821 of the second housing 220 through a third member through-hole 2622 formed through the second support member 261. According to an embodiment, at least one electronic component (e.g., a camera module or a sensor module) disposed in the first space 2101 may be disposed to face the direction of the flexible display module 230 through a module accommodating hole 2612 formed through the first support member 261.

According to various embodiments, when the first support member 261 is seen from above, a penetration structure of the first FPCB connection part 4711 through the first through-hole 4611 of the first reinforced plate 461 and the first member through-hole 2611 of the first support member 261 may be disposed to be included in the first waterproof space 4811 formed by the first waterproof structure WP1, to protect from external moisture and/or foreign materials. According to an embodiment, when the second support member 262 is seen from above, a penetration structure of the second FPCB connection part 4721 through the second through-hole 4621 of the second reinforced plate 462 and the second member through-hole 2621 of the second support member 262 may be disposed to be included in the fourth waterproof space 4821 formed by the second waterproof structure WP2, to protect from external moisture and/or foreign materials. According to an embodiment, when the second support member 262 was seen from above, a penetration structure of the third FPCB connection part 4323 configured to extend from the bending part 432 of the display panel (e.g., the display panel 430 of FIG. 4), which penetrates the third member through-hole 2622 of the second support member 262, may be disposed to be included in the fourth waterproof space 4821 formed by the second waterproof structure WP2, to protect from external moisture. According to an embodiment, when the first support member 261 is seen from above, the module accommodating groove 2612 formed through the first support member 261 may be disposed to be included in the second waterproof space 4812 formed by the first waterproof structure WP1, so that at least one electronic component is protected from external moisture.

According to various embodiments, the first digitizer panel 471 and the second digitizer panel 472, in order to shield electromagnetic signals, may include a shielding member (e.g., the first shielding member 810 of FIG. 8) (e.g., a magnetic metal powder (MMP)) disposed on the rear surface thereof. According to an embodiment, the first digitizer panel 471 and the second digitizer panel 472 may not require of the shielding member in the area where the first FPCB connection part 4711 and the second FPCB connection part 4721 are withdrawn. Accordingly, when the first reinforced plate 461 is seen from above, the first support member 261 may include a first shielding layer 471a (e.g., a shielding member or an MMP) disposed at a position corresponding to the first through-hole 4611. Therefore, the first member through-hole 2611 may be disposed at a position which does not overlap the first through-hole 4611. According to an embodiment, when the second reinforced plate 462 is seen from above, the second support member 262 may include a second shielding layer 472a (e.g., a shielding member or an MMP) disposed at a position corresponding to the second through-hole 4621. Accordingly, the second member through-hole 2621 may be disposed at a position which does not overlap the second through-hole 4621.

Figure 8:
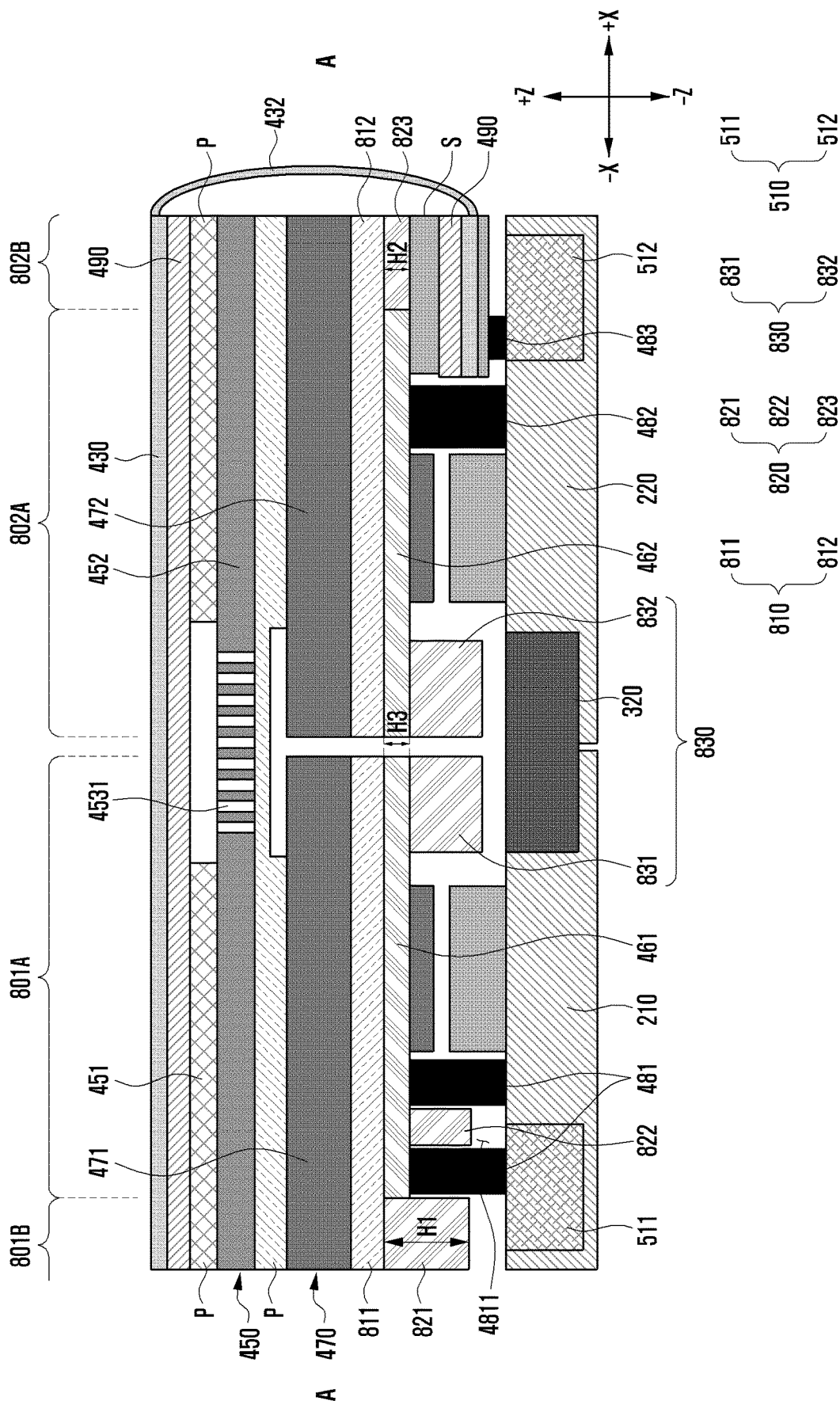
FIG. 8 is a cross-sectional view in taken along line X-X of FIG. 6 according to various embodiments.

FIG. 8 is a cross-sectional view taken along line X-X of FIG. 6, according to various embodiments.

An electronic device according to various embodiments disclosed in the disclosure may include a shielding structure. When an electronic component operates, electromagnetic waves generated from the outside may cause a problem in the operation of the electronic component. The shielding structure may block electromagnetic interference (EMI) or block interference caused by a magnetic field generated from a magnetic object such that an electronic component included in an electronic device normally operates within a set operating range. The shielding structure may include a shielding member made of various materials capable of performing an EMI shielding function. For example, the shielding member may include a material such as metal, carbon, and conductive polymer, or a material made of a combination thereof. The shielding member may be made of a material having high saturation magnetic flux density and high magnetic permittivity. For example, the shielding member may include an amorphous ribbon sheet (ARS) or a magnetic metal powder (MMP). The shielding member may be manufactured in various shapes. For example, the shielding member may be manufactured in the shape of a sheet or a film. For example, as described below, a first shielding member may include an MMP, and a second shielding member to a fourth shielding member may include an ARS.

The digitizer panel 470 configured to recognize the input of a pen input device using an electromagnetic resonance (EMR) manner may cause degradation of performance in pen recognition due to an external magnetic field. Accordingly, a shielding member capable of shielding a magnetic field may be disposed between an element generating a magnetic field and the digitizer panel 470. For example, elements such as a magnet member 510, the hinge device 320, and a sensor member of an electronic device may generate a magnetic field, and thus a shielding member may be disposed between the elements and the digitizer panel 470.

In an embodiment, an electronic device may include the magnet member 510. The magnet member 510 may include a first magnet 511 disposed in the first housing 210 and a second magnet 512 disposed in the second housing 220. The first magnet 511 and the second magnet 512 may be arranged at parts respectively corresponding to the first housing 210 and the second housing 220. When the electronic device is in a folded state, the first housing 210 and the second housing 220, which face each other, may maintain a state in which the first housing and the second housing are attached to each other through magnetic force (attraction force) of the first magnet 511 and the second magnet 512. The state may be maintained before until an external force greater than the magnetic force is applied to the housings 210 and 220.

According to various embodiments, a shielding member 810, 820, 830, and 840 may include a first shielding member 810, a second shielding member 820, a third shielding member 830, and a fourth shielding member 840. The classification of the shielding members may be classified merely for convenience according to positions where the shielding members are arranged, and may not classify the numbers or types of the shielding members. In addition, at least one of the first shielding member 810 to the fourth shielding member 840 may be omitted, and shielding members may be arranged at other positions not described in the disclosure.

The first shielding member 810, the second shielding member 820, and the third shielding member 830 may shield elements generating a magnetic field at various positions. For example, the first shielding member 810 may be disposed on the rear surface of the digitizer panel 470. The second shielding member 820 may be disposed on the rear surface of the first shielding member 810 and the rear surfaces of the reinforced plates 461 and 462. The third shielding member 830 may be disposed between the hinge device 320 and the display module 230. The fourth shielding member 840 may be disposed between a sensor member and the display module 230.

Referring to FIG. 8, the display module 230 may include a structure in which multiple layers are stacked each other. The layers of the display module 230 may include the display panel 430, the support member 450, the digitizer panel 470, and the reinforced plates 461 and 462. The layers included in the display module 230 may be fixed to each other by an adhesive P. Since the display module 230 illustrated in FIG. 8 is similar to the display module 230 illustrated in FIG. 4, the same or similar elements will be described using the same reference numerals, and detailed descriptions thereof will be omitted.

In an embodiment, a polymer film 490 may be disposed on the rear surface of the display panel 430. For example, the polymer film 490 may be made of poly imide (PI) or polyethylene terephthalate (PET). The polymer film 490 may be a substrate of the display panel 430. The polymer film 490 may be manufactured in the form of a patterned film shape including a pattern, a part of which is removed. For example, in consideration of the flexibility of the bending part 432, the polymer film 490 may be removed from a part of the bending part 432, which is bent.

In an embodiment, the digitizer panel 470 may be disposed in a first direction (e.g., the −Z direction of FIG. 8) with respect to the display panel 430. The digitizer panel 470 may include a first digitizer panel 471 disposed in an area corresponding to the first housing 210 and a second digitizer panel 472 disposed in an area corresponding to the second housing 220. As illustrated in in FIG. 8, the first digitizer panel 471 and the second digitizer panel 472 may be separated. In various embodiments, the first digitizer panel 471 and the second digitizer panel 472 may be integrally formed.

The area of the digitizer panel 470 may be divided into an outer area and a center area. Here, the area may be only conceptually divided for the convenience of the disclosure, and may not be actually physically separated on the digitizer panel 470. The electronic device disclosed in the disclosure may include the hinge device 320 configured to foldably connect the first housing 210 and the second housing 220. The hinge device 320 may be disposed between the first housing 210 and the second housing 220. In the description below, the outer area and the central area of the digitizer panel 470 may be divided by a relative positional relationship with respect to the hinge device 320 disposed between the first housing 210 and the second housing 220.

The first digitizer panel 471 may include a first area 801A and a second area 801B. The first area 801A may be an area relatively nearer to the hinge device 320 than the second area 801B. In other words, the second area 801B may be an area relatively farther away from the hinge device 320 than the first area 801A.

The second digitizer panel 472 may include a third area 802A and a fourth area 802B. The third area 802A may be an area relatively nearer to the hinge device 320 than the fourth area 802B. In other words, the fourth area 802B may be an area relatively farther away from the hinge device 320 than the third area 802A.

In an embodiment, the first shielding member 810 may be disposed on the rear surface of the digitizer panel 470. The "rear surface" may refer, for example, to a surface facing the first direction (e.g., the −Z direction of FIG. 8). The area of the first shielding member 810 may be determined to be applicable to the entire area (the first area 801A to the fourth area 802B) of the digitizer panel 470. The first shielding member 810 may include a (1-1)st shielding member 811 disposed on the rear surface of the first digitizer panel 471 and a (1-2)nd shielding member 812 disposed on the rear surface of the second digitizer panel 472.

In an embodiment, the reinforced plates 461 and 462 may be arranged on the rear surface of the first shielding member 810. Referring to FIG. 8, the reinforced plates 461 and 462 may include the first reinforced plate 461 disposed on the rear surface of the (1-1)st shielding member 811 and the second reinforced plate 462 disposed on the rear surface of the (1-2)nd shielding member 812. The reinforced plates 461 and 462 may be disposed on the rear surface of the first shielding member 810 in an area adjacent to the hinge device 320. In an embodiment, at least a part of the first reinforced plate 461 may be disposed in the first area 801A of the first digitizer panel 471, and at least a part of the second reinforced plate 462 may be disposed in the third area 802A of the second digitizer panel 472.

In an embodiment, the second shielding member 820 may include a (2-1)st shielding member 821, a (2-2)nd shielding member 822, and a (2-3)rd shielding member 823. The (2-1)st shielding member 821 and the (2-2)nd shielding member 822 may be the second shielding member 820 disposed in an area corresponding to the first housing 210, and the (2-3)rd shielding member 823 may be the second shielding member 820 disposed in an area corresponding to the second housing 220.

Referring to FIG. 8, the (2-1)st shielding member 821 may be disposed on the rear surface of the (1-1)st shielding member 811, and the (2-2)nd shielding member 822 may be disposed on the rear surface of the first reinforced plate 461. In an embodiment, a part of the first reinforced plate 461 may be removed or the size of the first reinforced plate 461 may be adjusted, such that the (2-1)st shielding member 821 is disposed on the rear surface of the (1-1)st shielding member 811. The (2-1)st shielding member 821 may be disposed at a part corresponding to the second area 801B of the digitizer panel 470. The (2-1)st shielding member 821 and the (2-2)nd shielding member 822 may be arranged to be spaced apart from each other. Referring to FIG. 6 and FIG. 8, the first waterproof member 481 may be disposed between the (2-1)st shielding member 821 and the (2-2)nd shielding member 822. The (2-1)st shielding member 821 and the (2-2)nd shielding member 822 may be separate elements and may be arranged with the first waterproof member 481 interposed therebetween. In various embodiments, the (2-1)st shielding member 821 and the (2-2)nd shielding member 822 may be integrally formed and then may be separated through a separation method such as cutting, and thus the first waterproof member 481 may be disposed between the (2-1)st shielding member 821 and the (2-2)nd shielding member 822.

Referring to FIG. 8, the (2-1)st shielding member 821 may be disposed between the first magnet 511 and the first digitizer panel 471, and the (2-2)nd shielding member 822 may be disposed at a position adjacent to the first magnet 511. The (2-1)st shielding member 821 and the (2-2)nd shielding member 822 may shield the magnetic field generated from the first magnet 511 to reduce the influence of the magnetic field on the operation of the digitizer panel 470. The first magnet 511 may be an element for maintaining a folded state of the first housing 210 and the second housing 220, and may be disposed on the outer side part of the first housing 210. The (2-1)st shielding member 821 and the (2-2)nd shielding member 822 may be elements for shielding the first magnet 511, and thus may be required to be arranged adjacent to the first magnet 511. On the other hand, a waterproof space may be formed by the space surrounded by the first waterproof member 481, and thus considering the size of the waterproof space, it is preferable that the first waterproof member 481 is disposed on the outer side part of the display module 230. In summary, the (2-1)st shielding member 821 and the (2-2)nd shielding member 822 should be disposed on the outer side part of the display module 230 in order to shield the first magnet 511 disposed on the outer side part thereof, and considering the size of the waterproof space, it is preferable that the first waterproof member 481 is also disposed on the outer side part of the display module 230. Therefore, interference may occur between the arrangement positions of the (2-1)st shielding member 821, and the (2-2)nd shielding member 822 and the first waterproof member 481. According to various embodiments disclosed in the disclosure, the (2-1)st shielding member 821 and the (2-2)nd shielding member 822 may be separated and the first waterproof member 481 may be disposed therebetween, thereby avoiding interference between elements and effectively performing functions of elements.

Referring to FIG. 6 and FIG. 8, the (2-2)nd shielding member 822 may be disposed within the first waterproof space 4811 formed by being surrounded by the first waterproof member 481. On the other hand, the (2-1)st shielding member 821 may be disposed outside the first waterproof space 4811 and thus may be exposed to moisture. In an embodiment, the (2-1)st shielding member 821 may include a waterproof structure capable of having resistance against moisture. On the other hand, the (2-2)nd shielding member 822 disposed inside the waterproof space may be configured as a non-waterproof structure.

Referring to FIG. 8, the (2-3)rd shielding member 823 may be disposed on the rear surface of the (1-2)nd shielding member 812. A part of the second reinforced plate 462 may be removed or the size of the second reinforced plate 462 may be adjusted, such that the (2-3)rd shielding member 823 is disposed on the rear surface of the (1-2)nd shielding member 812. The (2-3)rd shielding member 823 may be disposed in the fourth area 802B of the second digitizer panel 472. The (2-3)rd shielding member 823 may be positioned between the second magnet 512 and the second digitizer panel 472. The (2-3)rd shielding member 823 may shield the magnetic field generated from the second magnet 512.

As illustrated in FIG. 8, the bending part 432 connected to the display panel 430 may be configured to extend to the rear surface of the second reinforced plate 462, and the bending part 432 configured to extend to the rear surface of the second reinforced plate 462 may be configured to face the second reinforced plate 462 and the (2-3)rd shielding member 823. A step difference compensation member S configured to fill the space between the bending part 432, the second reinforced plate 462, and the (2-3)rd shielding member 823 may be disposed between the bending part 432, the second reinforced plate 462, and the (2-3)rd shielding member 823. When there is a step difference at the boundary part between the second reinforced plate 462 and the (2-3)rd shielding member 823, a defect may occur in the bending part 432 facing the second reinforced plate 462 and the (2-3)rd shielding member 823. In order to reduce the step difference between the second reinforced plate 462 and the (2-3)rd shielding member 823, the (2-3)rd shielding member 823 may be formed to have a thickness H2 substantially identical to the thickness H3 of the second reinforced plate 462. The forming "substantially the same" may refer, for example, to forming to have the same thickness, and may include forming to have slightly different thickness due to various causes (e.g., a process error).

On the other hand, a step difference may be formed between the (2-1)st shielding member 821 and the first reinforced plate 461, and thus in consideration of the shielding performance of the (2-1)st shielding member 821, the thickness H1 of the (2-1)st shielding member 821 may be greater than the thickness H3 of the first reinforced plate 461. In an embodiment, the thickness H1 of the (2-1)st shielding member 821 may be greater than the thickness H2 of the (2-3)rd shielding member 823.

In an embodiment, the third shielding member 830 may be disposed between the hinge device 320 and the display module 230. In an embodiment, the hinge device 320 may include a magnetic body, or may include a material capable of being magnetized by the surrounding magnetic body. When the hinge device 320 includes a magnetic body or is magnetized, a magnetic field may be generated in the hinge device 320, and the magnetic field may affect the operation of the digitizer panel. The third shielding member 830 may shield the magnetic field of the hinge device 320.

Referring to FIG. 6 and FIG. 8, the third shielding member 830 may be disposed on the rear surfaces of the reinforced plates 461 and 462. The third shielding member 830 may include a (3-1)st shielding member 831 disposed on the rear surface of the first reinforced plate 461 and a (3-2)nd shielding member 832 disposed on the rear surface of the second reinforced plate panel 462. As illustrated in FIG. 6, the (3-1)st shielding member 831 may be provided with multiple shielding members arranged to be spaced apart from each other. The (3-2)nd shielding member 831 may be also provided with multiple shielding members arranged to be spaced apart from each other.

In an embodiment, the fourth shielding member 840 may be disposed between a sensor member (not shown) and the display module 230. In various embodiments, the electronic device may include a sensor member to detect a folded state or an unfolded state of the electronic device. In an embodiment, the sensor member may include a Hall sensor (not shown) and a magnet (not shown) disposed at a position corresponding to the Hall sensor. For example, the Hall sensor may be disposed in one of the first housing 210 or second housing 220, and the magnet may be disposed in the other of the first housing 210 or second housing 220, which the Hall sensor is not disposed. When the Hall sensor and the magnet are respectively arranged in the first housing 210 and the second housing 220 which are configured to relatively move, the strength of the magnetic field recognized by the Hall sensor may change depending on the relative distance between the magnet and the Hall sensor, and using the change, the folded state or the unfolded state of the first housing 210 and the second housing 220 may be detected. The fourth shielding member 840 may be disposed between at least one of a Hall sensor and a magnet of the sensor member and the display module 230, to shield a magnetic field generated in the sensor member.

According to various embodiments, the waterproof member 481, 482, 483, and 484 may disposed between the display module 230 and the housing, to block the display module 230 and electrical parts connected to the display module 230 from external moisture.

Referring to FIG. 8, the first waterproof member 481 may be disposed between the display module 230 and the first housing 210. For example, the first waterproof member 481 may be disposed on the rear surface of the first reinforced plate 461. The first waterproof member 481 may form multiple closed spaces (e.g., the first waterproof space 4811, 4812, and 4813 of FIG. 6) surrounded by the first waterproof member 481. External moisture may not flow into the space formed by the display module 230, the first waterproof member 481, and the first housing 210. In an embodiment, at least a part of the first waterproof member 481 may be disposed between the (2-1)st shielding member 821 and the (2-2)nd shielding member 822.

Referring to FIG. 6 and FIG. 8, the second waterproof member 482, 483, and 484 may be disposed between the display module 230 and the second housing 220. For example, the second waterproof member 482, 483, 484 may be disposed on the rear surface of the second reinforced plate 462. In an embodiment, the second waterproof member 482, 483, and 484 may include the (2-1)st waterproof member 482 disposed on the rear surface of the second reinforced plate 462, the (2-2)nd waterproof member 483 disposed on the rear surface of the bending part 432, and the (2-3)rd waterproof member 484 configured to connect the (2-1)st waterproof member 482 and the (2-2)nd waterproof member 483.

The (2-1)st waterproof member 482 may be disposed on the second reinforced plate 462 and the (2-2)nd waterproof member 483 may be disposed on the rear surface of the bending part 432, and thus a height difference may occur between the (2-1)st waterproof member 482 and the (2-2)nd waterproof member 483. In an embodiment, the (2-3)rd waterproof member 484, which is in a liquid phase, may be dispensed into a part capable of connecting the (2-1)st waterproof member 482 and the (2-2)nd waterproof member 483 and then may be cured, and thus may connect the (2-1)st waterproof member 482 and the (2-2)nd waterproof member 483 without a gap while compensating for the height difference.

Figure 9:
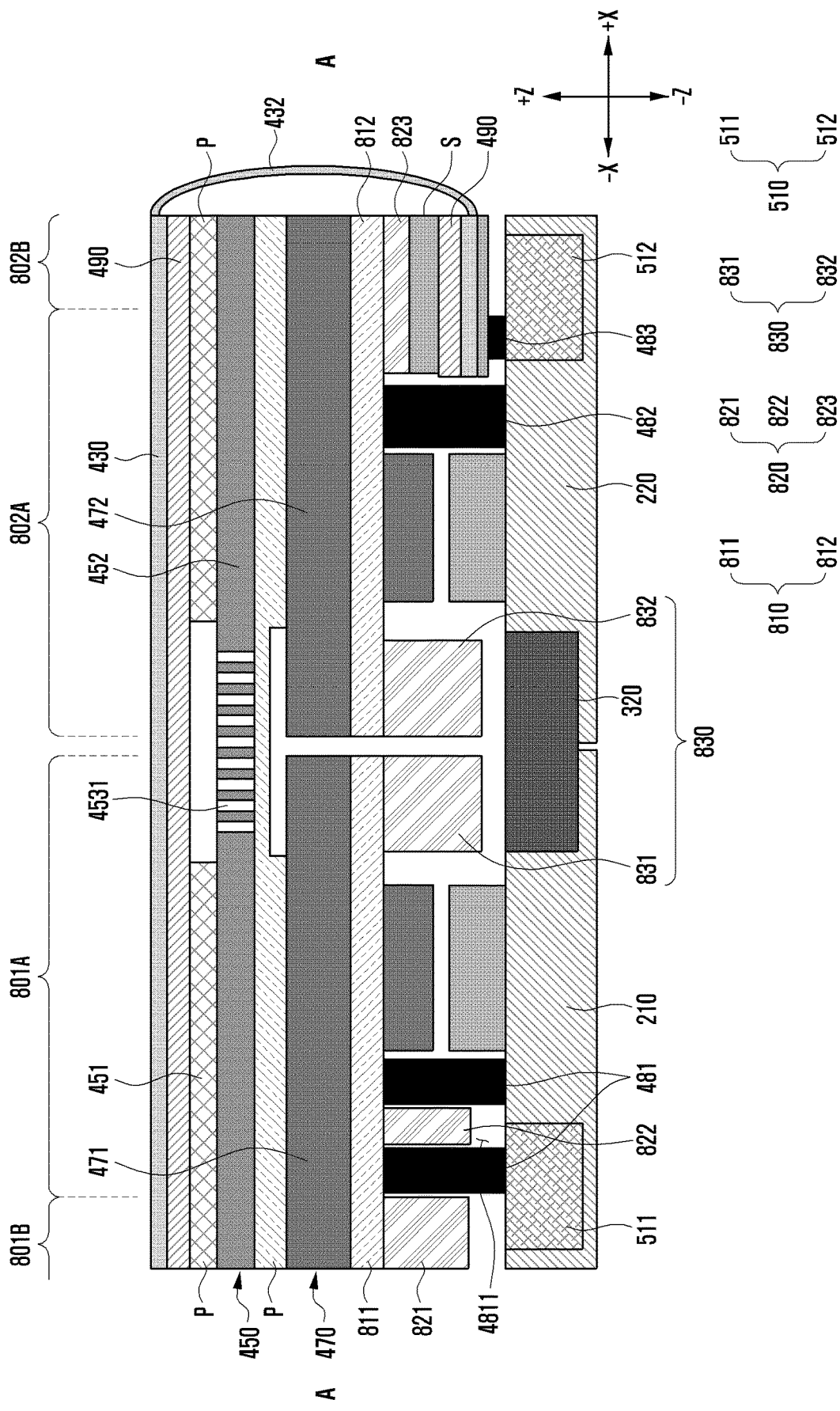
FIG. 9 is a cross-sectional view of a display module according to various embodiments.

FIG. 9 is a cross-sectional view of a display module according to various embodiments.

The embodiment of the display module illustrated in FIG. 9 may be similar to the embodiment of the display module illustrated in FIG. 8, and thus the differences therebetween will be mainly described.

Unlike the display module illustrated in FIG. 8, the display module illustrated in FIG. 9 may not include reinforced plates 461 and 462. Therefore, various elements arranged on the rear surface of the reinforced plates 461 and 462 of FIG. 8 may be arranged on the rear surface of the first shielding member 810. For example, the first waterproof member 481 may be disposed on the rear surface of the (1-1)st shielding member 811, and the second waterproof member 482 may be disposed on the rear surface of the (1-2)nd shielding member 812. The (2-2)nd shielding member 822 may be disposed on the rear surface of the (1-1)st shielding member 811. The third shielding member 830 may be disposed on the rear surface of the first shielding member 810. The (3-1)st shielding member 831 may be disposed on the rear surface of the (1-1)st shielding member 811, and the (3-2)nd shielding member 832 may be disposed on the rear surface of the (1-2)nd shielding member 812.

Meanwhile, the (2-3)rd shielding member 823 may be disposed between the bending part 432 extending to the rear surface of the display module and the (1-2)nd shielding member 812. The area of the (1-2)nd shielding member 812 may be adjusted to cover all of the bending part 432 facing the (1-2)nd shielding member 812.

According to various example embodiments, an electronic device (e.g., the electronic device 200 of FIG. 1A) may include: a housing including a first housing (e.g., the first housing 210 of FIG. 1A) and a second housing (e.g., the second housing 220 in FIG. 1A) foldably connected with respect to the first housing, a magnet member (e.g., the magnet member 510 of FIG. 8) including a first magnet (e.g., the first magnet 511 of FIG. 8) disposed in the first housing and a second magnet (e.g., the second magnet 512 of FIG. 8) disposed in the second housing to face the first magnet based on the housing being in a folded state, a hinge (e.g., the hinge device 320 of FIG. 8) foldably connecting the first housing and the second housing, and a flexible display module (e.g., the flexible display module 230 of FIG. 4) configured to be folded at least partially by folding of the housing, wherein the flexible display module may include a foldable display panel (e.g., the display panel 430 of FIG. 8) configured to be at least partially deformed by folding of the housing, a digitizer panel (e.g., the digitizer panel 470 of FIG. 8) including a first digitizer panel (e.g., the first digitizer panel 471 of FIG. 8) including a first area (e.g., the first area 801A of FIG. 8) disposed in the first housing and adjacent to the hinge, and a second area (e.g., the second area 801B of FIG. 8) spaced apart from the hinge compared to the first area, and a second digitizer panel (e.g., the second digitizer panel 472 of FIG. 8) including a third area (e.g., the third area 802A of FIG. 8) disposed in the second housing and adjacent to the hinge, and a fourth area (e.g., the fourth area 802B of FIG. 8) spaced apart from the hinge compared to the third area, the digitizer panel being disposed in a first direction with respect to the display panel, a first shielding member (e.g., the first shielding member 810 of FIG. 8) comprising a shield including a first first shielding member (e.g., the (1-1)st shielding member 811 of FIG. 8) disposed on the first digitizer panel and a second first shielding member (e.g., the (1-2)nd shielding member 812 of FIG. 8) disposed on the second digitizer panel, the first shielding member disposed on the rear surface of the digitizer panel, a reinforced plate including a first reinforced plate (e.g., the first reinforced plate 461 of FIG. 8), at least a part of which is disposed in the first area of the first digitizer panel, and a second reinforced plate (e.g., the second reinforced plate 462 of FIG. 8), at least partially disposed in the third area of the second digitizer panel, the reinforced plate being disposed on the rear surface of the first shielding member, a second shielding member (e.g., the second shielding member 820 of FIG. 8) including a shield including a first second shielding member (e.g., the (2-1)st shielding member 821 of FIG. 8), at least a part of which is disposed on the rear surface of the first first shielding member in the second area of the first digitizer panel positioned between the first magnet and the first digitizer panel, a second second shielding member (e.g., the (2-2)nd shielding member 822 of FIG. 8) disposed on the rear surface of the first reinforced plate, and a third second shielding member (e.g., the (2-3)rd shielding member 823 of FIG. 8), at least a part of which is disposed on the rear surface of the second first shielding member in the fourth area of the second digitizer panel positioned between the second magnet and the second digitizer panel, and a waterproof structure including a first waterproof member (e.g., the first waterproof member 481 of FIG. 8) comprising a waterproof material, at least a part of which is disposed on the rear surface of the first reinforced plate disposed between the first second shielding member and the second second shielding member, and a second waterproof member (e.g., the second waterproof member 482 and 483 of FIG. 8) comprising a waterproof material, at least a part of which is disposed on the rear surface of the second reinforced plate.

In addition, a thickness of the third second shielding member is less than a thickness of the first second shielding member.

In addition, the thickness of the third second shielding member may be substantially identical to a thickness of the second reinforced plate.

In addition, the flexible display module may further include a bending part (e.g., the bending part 432 of FIG. 8) connected to the display panel and extending to the rear surface of the second reinforced plate, and the bending part may face the second reinforced plate and the third second shielding member.

In addition, the bending part may be integrally formed with a substrate of the display panel.

In addition, the second waterproof member may include a first second waterproof member (e.g., the (2-1)st waterproof member 482 of FIG. 6) disposed on the rear surface of the second reinforced plate, a second second waterproof member (e.g., the (2-2)nd waterproof member 483 of FIG. 6) disposed on the rear surface of the bending part, and a third second waterproof member (e.g., the (2-3)rd waterproof member 484 of FIG. 6) configured to connect the first second waterproof member and the second second waterproof member.

In addition, the second second shielding member of the second shielding member may be positioned in a waterproof space (e.g., the waterproof space 4811 of FIG. 8) surrounded by the first waterproof member.

In addition, the first second shielding member and the third second shielding member may be configured to enable waterproofing, and the second second shielding member may have a non-waterproof structure.

In addition, the flexible display module may further include a third shielding member (e.g., the third shielding member 830 of FIG. 8) comprising a shield including a first third shielding member (e.g., the (3-1)st shielding member 831 of FIG. 8) disposed on the rear surface of the first reinforced plate in the first area of the first digitizer panel between the first reinforced plate and the hinge, and a second third shielding member (e.g., the (3-2)nd shielding member 832 of FIG. 8) disposed on the rear surface of the second reinforced plate in the third area of the second digitizer panel between the second reinforced plate and the hinge.

In addition, a sensor member including a Hall sensor disposed in one of the first housing and the second housing and a sensing magnet disposed in the other one of the first housing and the second housing configured to sense a folded state of the housing may be further included therein, and a fourth shielding member (e.g., the fourth shielding member 840 of FIG. 6) comprising a shield disposed between the sensor member and the flexible display module may be further included therein.

According to various example embodiments, a flexible display module (e.g., the flexible display module 230 of FIG. 4) supported by a first housing (e.g., the first housing 210 of FIG. 1A) and a second housing (e.g., the second housing 220 of FIG. 1A) foldably connected by a hinge (e.g., the hinge device 320 of FIG. 8) and at least a part of which is configured to be folded, may include: a display panel (e.g., the display panel 430 of FIG. 8) configured to be deformed by folding of the housing, a digitizer panel (e.g., the digitizer panel 470 of FIG. 8) including a first digitizer panel (e.g., the first digitizer panel 471 of FIG. 8) disposed in the first housing and including a first area (e.g., the first area 801A of FIG. 8) adjacent to the hinge and a second area (e.g., the second area 801B of FIG. 8) spaced apart from the hinge compared to the first area, and a second digitizer panel (e.g., the second digitizer panel 472 of FIG. 8) disposed in the second housing and including a third area (e.g., the third area 802A of FIG. 8) adjacent to the hinge and a fourth area (e.g., the fourth area 802B of FIG. 8) spaced apart from the hinge compared to the third area, the digitizer panel being disposed in a first direction with respect to the display panel, a first shielding member (e.g., the first shielding member 810 of FIG. 8) comprising a shield including a first first shielding member (e.g., the (1-1)st shielding member 811 of FIG. 8) disposed on the first digitizer panel and a second first shielding member (e.g., the (1-2)nd shielding member 812 of FIG. 8) disposed on the second digitizer panel, the first shielding member being disposed on the rear surface of the digitizer panel, a reinforced plate including a first reinforced plate (e.g., the first reinforced plate 461 of FIG. 8), at least a part of which is disposed in the first area of the first digitizer panel, and a second reinforced plate (e.g., the second reinforced plate 462 of FIG. 8), at least a part of which is disposed in the third area of the second digitizer panel, the reinforced plate being disposed on the rear surface of the first shielding member, a second shielding member (e.g., the second shielding member 820 of FIG. 8) comprising a shield including a first second shielding member (e.g., the (2-1)st shielding member 821 of FIG. 8), at least a part of which is disposed on the rear surface of the first first shielding member in the second area of the first digitizer panel positioned between a first magnet and the first digitizer panel, a second second shielding member (e.g., the (2-2)nd shielding member 822 of FIG. 8) disposed on the rear surface of the first reinforced plate, and a third second shielding member (e.g., the (2-3)rd shielding member 823 of FIG. 8), at least a part of which is disposed on the rear surface of the second first shielding member in the fourth area of the second digitizer panel between a second magnet and the second digitizer panel, and a waterproof structure comprising a waterproof material including a first waterproof member (e.g., the first waterproof member 481 of FIG. 8), at least a part of which is disposed on the rear surface of the first reinforced plate between the first second shielding member and the second second shielding member, and a second waterproof member (e.g., the second waterproof member 482 and 483 of FIG. 8) comprising a waterproof material, at least a part of which is disposed on the rear surface of the second reinforced plate.

In addition, a thickness of the third second shielding member is less than a thickness of the first second shielding member.

In addition, the thickness of the third second shielding member may be substantially identical to a thickness of the second reinforced plate.

In addition, the display panel may include a bending part (e.g., the bending part 432 of FIG. 8) connected to the display panel and extending to the rear surface of the second reinforced plate may be further included therein, wherein the bending part may face the second reinforced plate and the third second shielding member.

In addition, the bending part may be integrally formed with a substrate of the display panel.

In addition, the second waterproof member may include a first second waterproof member (e.g., the (2-1)st waterproof member 482 of FIG. 6) disposed on the rear surface of the second reinforced plate, a second second waterproof member (e.g., the (2-2)nd waterproof member 483 of FIG. 6) disposed on the rear surface of the bending part, and a third second waterproof member (e.g., the (2-3)rd waterproof member 484 of FIG. 6) configured to connect the (2-1)st waterproof member and the second second waterproof member.

In addition, the second second shielding member of the second shielding member may be positioned in a waterproof space (e.g., the waterproof space 4811 of FIG. 8) surrounded by the first waterproof member.

In addition, the first second shielding member and the third second shielding member may be configured to enable waterproofing, and the second second shielding member may be configured to have a non-waterproof structure.

In addition, a third shielding member (e.g., the third shielding member 830 of FIG. 8) comprising a shield including a first third shielding member (e.g., the (3-1)st shielding member 831 of FIG. 8) disposed on the rear surface of the first reinforced plate in the first area of the first digitizer panel disposed between the first reinforced plate and the hinge, and a second third shielding member (e.g., the (3-2)nd shielding member 832 of FIG. 8) disposed on the rear surface of the second reinforced plate in the third area of the second digitizer panel disposed between the second reinforced plate and the hinge may be further included therein.

In addition, a fourth shielding member (e.g., the fourth shielding member 840 of FIG. 6) including a shield disposed in a position corresponding to a sensor member including a sensor configured to sense a folded state of the electronic device may be further included therein.

In the above descriptions, although it is described that the flexible display module includes the shielding member 810, 820, 830, and 840 and the waterproof member 481, 482, 483, and 484, the shielding member and the waterproof member may not be elements of the flexible display module. For example, it may be understood that the shielding member and the waterproof member, which is configured separately from the flexible display module, are arranged in the flexible display module.

While the disclosure has been illustrated and described with reference to various example embodiments, it will be understood that the various example embodiments are intended to be illustrative, not limiting. Accordingly, it should be understood that the scope of various embodiments of the disclosure includes not only the example embodiments disclosed herein, but also all changed or modified forms derived based on the technical idea of the disclosure including the appended claims and their equivalents. It will also be understood that any of the embodiment(s) described herein may be used in conjunction with any other embodiment(s) described herein.

What is claimed is:

1. An electronic device comprising:
a housing comprising a first housing and a second housing foldably connected to the first housing;
a magnet member comprising a first magnet disposed in the first housing and a second magnet disposed in the second housing to face the first magnet based on the housing being in a folded state;
a hinge configured to foldably connect the first housing and the second housing; and
a flexible display module configured to be folded by folding of the housing, wherein
the flexible display module comprises:
a display panel formed configured to be deformed by folding of the housing,
a digitizer panel comprising a first digitizer panel disposed in the first housing and including a first area adjacent to the hinge and a second area spaced apart from the hinge compared to the first area, and a second digitizer panel disposed in the second housing and including a third area adjacent to the hinge and a fourth area spaced apart from the hinge compared to the third area, the digitizer panel being disposed in a first direction with respect to the display panel,
a first shielding member including a shield which comprises a first first shielding member disposed on the first digitizer panel and a second first shielding member disposed on the second digitizer panel, the first shielding member being disposed on the rear surface of the digitizer panel,
a reinforced plate comprising a first reinforced plate, at least a part of which is disposed in the first area of the first digitizer panel, and a second reinforced plate, at least a part of which is disposed in the third area of the second digitizer panel, the reinforced plate being disposed on the rear surface of the first shielding member,
a second shielding member including a shield comprising a first second shielding member, at least a part of which is disposed on a rear surface of the first first shielding member in the second area of the first digitizer panel between the first magnet and the first digitizer panel, a second second shielding member disposed on the rear surface of the first reinforced plate, and a third second shielding member, at least a part of which is disposed on the rear surface of the second first shielding member in the fourth area of the second digitizer panel between the second magnet and the second digitizer panel, and
a waterproof structure comprising a waterproof material comprising a first waterproof member, at least a part of which is disposed on the rear surface of the first reinforced plate between the first second shielding member and the second second shielding member, and a second waterproof member, at least a part of which is disposed in the first direction of the second reinforced plate.

2. The electronic device of claim 1, wherein:
a thickness of the third second shielding member is less than a thickness of the first second shielding member.

3. The electronic device of claim 1, wherein
a thickness of the third second shielding member is substantially identical to a thickness of the second reinforced plate.

4. The electronic device of claim 1, wherein
the flexible display module further comprises:
a bending part connected to the display panel and extending to the rear surface of the second reinforced plate, and
the bending part faces the second reinforced plate and the third second shielding member.

5. The electronic device of claim 4, wherein
the bending part is integrally formed with a substrate of the display panel.

6. The electronic device of claim 4, wherein
the second waterproof member comprises:
a first second waterproof member disposed on the rear surface of the second reinforced plate, a second second waterproof member disposed on the rear surface of the bending part, and a third second waterproof member configured to connect the first second waterproof member and the second second waterproof member.

7. The electronic device of claim 1, wherein
the second second shielding member of the second shielding member is positioned in a waterproof space surrounded by the first waterproof member.

8. The electronic device of claim 7, wherein
the first second shielding member and the third second shielding member are configured to enable waterproofing, and the second second shielding member has a non-waterproof structure.

9. The electronic device of claim 1, wherein
the flexible display module further comprises:
a third shielding member including a shield comprising a first third shielding member disposed on the rear surface of the first reinforced plate in the first area of the first digitizer panel disposed between the first reinforced plate and the hinge, and a second third shielding member disposed on the rear surface of the second reinforced plate in the third area of the second digitizer panel disposed between the second reinforced plate and the hinge.

10. The electronic device of claim 1, further comprising
a sensor member comprising a Hall sensor disposed in one of the first housing and the second housing and a sensing magnet disposed in the other one of the first housing and the second housing and configured to sense a folded state of the housing; and
a fourth shielding member disposed between the sensor member and the flexible display module.

11. A flexible display module supported by a first housing and a second housing foldably connected by a hinge and at least a part of which is configured to be folded, the display module comprising:
a display panel configured to be deformed by folding of the housing;
a digitizer panel comprising a first digitizer panel disposed in the first housing and including a first area adjacent to the hinge and a second area spaced apart from the hinge compared to the first area, and a second digitizer panel disposed in the second housing and including a third area adjacent to the hinge and a fourth area spaced apart from the hinge device compared to the third area, the digitizer panel being disposed in a first direction with respect to the display panel;
a first shielding member including a shield comprising a first first shielding member disposed on the first digitizer panel and a second first shielding member disposed on the second digitizer panel, the first shielding member being disposed on the rear surface of the digitizer panel;
a reinforced plate comprising a first reinforced plate, at least a part of which is disposed in the first area of the first digitizer panel, and a second reinforced plate, at least a part of which is disposed in the third area of the second digitizer panel, the reinforced plate being disposed on the rear surface of the first shielding member;
a second shielding member including a shield comprising a first second shielding member, at least a part of which is disposed on the rear surface of the first first shielding member in the second area of the first digitizer panel disposed between a first magnet and the first digitizer panel, a second second shielding member disposed on the rear surface of the first reinforced plate, and a third second shielding member, at least a part of which is disposed on the rear surface of the second first shielding member in the fourth area of the second digitizer panel positioned between a second magnet and the second digitizer panel; and
a waterproof structure comprising a waterproof material comprising a first waterproof member, at least a part of which is disposed on the rear surface of the first reinforced plate disposed between the first second shielding member and the second second shielding member, and a second waterproof member, at least a part of which is disposed in the first direction of the second reinforced plate.

12. The display module of claim 11, wherein:
a thickness of the third second shielding member is less than a thickness of the first second shielding member.

13. The display module of claim 11,
a thickness of the third second shielding member is substantially identical to a thickness of the second reinforced plate.

14. The display module of claim 11, further comprising:
a bending part connected to the display panel and extending to the rear surface of the second reinforced plate, wherein
the bending part faces the second reinforced plate and the third second shielding member.

15. The display module of claim 14, wherein
the bending part is integrally formed with a substrate of the display panel.

16. The display module of claim 14, wherein
the second waterproof member comprises:
a first second waterproof member disposed on the rear surface of the second reinforced plate, a second second waterproof member disposed on the rear surface of the bending part, and a third second waterproof member connecting the first second waterproof member and the second second waterproof member.

17. The display module of claim 11, wherein
the second second shielding member of the second shielding member is positioned in a waterproof space surrounded by the first waterproof member.

18. The display module of claim 17, wherein
the first second shielding member and the third second shielding member are configured to enable waterproofing, and the second second shielding member has a non-waterproof structure.

19. The display module of claim 11, further comprising:
a third shielding member comprising a shield comprising a first third shielding member disposed on the rear surface of the first reinforced plate in the first area of the first digitizer panel disposed between the first reinforced plate and the hinge, and a second third shielding member disposed on the rear surface of the second reinforced plate in the third area of the second digitizer panel disposed between the second reinforced plate and the hinge.

20. The display module of claim 11, further comprising:
a fourth shielding member comprising a shield disposed in a position corresponding to a sensor member comprising a sensor configured to sense a folded state of the electronic device.

* * * * *